(12) United States Patent
Kishi et al.

(10) Patent No.: US 10,090,208 B2
(45) Date of Patent: Oct. 2, 2018

(54) EVALUATION METHOD FOR OXIDE SEMICONDUCTOR THIN FILM, QUALITY CONTROL METHOD FOR OXIDE SEMICONDUCTOR THIN FILM, AND EVALUATION ELEMENT AND EVALUATION DEVICE USED IN THE EVALUATION METHOD

(71) Applicant: Kobe Steel, Ltd., Kobe-shi (JP)

(72) Inventors: Tomoya Kishi, Kobe (JP); Kazushi Hayashi, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/654,736

(22) PCT Filed: Jan. 9, 2014

(86) PCT No.: PCT/JP2014/050177
§ 371 (c)(1),
(2) Date: Jun. 22, 2015

(87) PCT Pub. No.: WO2014/109343
PCT Pub. Date: Jul. 17, 2014

(65) Prior Publication Data
US 2015/0371906 A1    Dec. 24, 2015

(30) Foreign Application Priority Data

Jan. 11, 2013  (JP) ................................ 2013-004061
Mar. 26, 2013  (JP) ................................ 2013-065193
Dec. 3, 2013   (JP) ................................ 2013-250627

(51) Int. Cl.
*H01L 21/00*   (2006.01)
*H01L 21/66*   (2006.01)
(Continued)

(52) U.S. Cl.
CPC .......... *H01L 22/12* (2013.01); *H01L 27/1225* (2013.01); *H01L 29/24* (2013.01);
(Continued)

(58) Field of Classification Search
CPC ......... H01L 29/66969; H01L 29/78603; H01L 22/12; H01L 27/1225; H01L 29/24; H01L 29/7869; G01R 31/2656; G01R 1/2642
See application file for complete search history.

(56) References Cited

U.S. PATENT DOCUMENTS

2010/0117071 A1* 5/2010 Inoue ................ H01L 29/66969
                                                257/43
2012/0203473 A1 8/2012 Hayashi et al.
(Continued)

FOREIGN PATENT DOCUMENTS

CN    102313849 A    1/2012
CN    102792451 A    11/2012
(Continued)

OTHER PUBLICATIONS

Tomoya Kishi, et al., "Evaluation of electronic and optical properties in oxide semiconductors (I)—Process dependences of electronic states examined by cathodoluminescence-" Electronic Research Laboratory, 2012, 1 Page (submitting English translation only).
(Continued)

*Primary Examiner* — A. Sefer
(74) *Attorney, Agent, or Firm* — Oblon, McClelland, Maier & Neustadt, L.L.P.

(57) ABSTRACT

Provided are: a method for measuring and evaluating (predicting or estimating) stress stability of an oxide semiconductor thin film in a contactless manner; and a quality control method for an oxide semiconductor. This evaluation method comprises a first step and a second step. The first step includes: subjecting an oxide semiconductor thin film to
(Continued)

irradiation with both excitation light and microwave radiation; stopping the irradiation with the excitation light after the maximum intensity of reflected wave of the microwave radiation, which varies with the irradiation of the excitation light, from the thin film has been observed; and thereafter measuring a variation in the reflectance with which the microwave radiation is reflected by the thin film. The second step includes: calculating, from the variation in the reflectance, a parameter that corresponds to slow attenuation observed about 1 μs after the stopping; and thus evaluating the stress stability of the oxide semiconductor.

20 Claims, 17 Drawing Sheets

(51) Int. Cl.
    *H01L 29/786*     (2006.01)
    *H01L 29/66*     (2006.01)
    *H01L 27/12*     (2006.01)
    *H01L 29/24*     (2006.01)
    *G01R 31/26*     (2014.01)
    *G01R 31/265*     (2006.01)
    *G01R 31/28*     (2006.01)
    *G01R 31/308*     (2006.01)

(52) U.S. Cl.
    CPC .... *H01L 29/66969* (2013.01); *H01L 29/7869* (2013.01); *H01L 29/78603* (2013.01); *G01R 31/2608* (2013.01); *G01R 31/2621* (2013.01); *G01R 31/2642* (2013.01); *G01R 31/2656* (2013.01); *G01R 31/2894* (2013.01); *G01R 31/308* (2013.01)

(56) References Cited

U.S. PATENT DOCUMENTS

| | | | |
|---|---|---|---|
| 2013/0009111 A1 | 1/2013 | Morita et al. | |
| 2013/0153778 A1 | 6/2013 | Sakoda et al. | |
| 2013/0240802 A1* | 9/2013 | Miki | C23C 14/3407 |
| | | | 252/519.15 |
| 2015/0355095 A1* | 12/2015 | Hayashi | G01N 21/6489 |
| | | | 250/459.1 |

FOREIGN PATENT DOCUMENTS

| | | |
|---|---|---|
| JP | 2008-191123 A | 8/2008 |
| JP | 2009-164393 A | 7/2009 |
| JP | 2012-19207 A | 1/2012 |
| JP | 2012-33857 A | 2/2012 |
| JP | 2014-19931 A | 2/2014 |
| TW | 201226892 A1 | 7/2012 |
| WO | 2014/112153 A1 | 7/2014 |
| WO | 2015-037596 A1 | 3/2015 |

OTHER PUBLICATIONS

Tomoya Kishi, et al., "Evaluation of electronic and optical properties in oxide semiconductors(I), Process dependences of electronic states examined by cathodoluminescence", Japan Society of Applied Physics and Related Societies, Total 2 Pages, (Mar. 2012).

Satoshi Yasuno, et al., "Carrier-Lifetime Measurement of IGZO film by Microwave Photo Conductivity Decay", The Japan Society of Applied Physics, p. 21-033, (2010).

Shingo Sumie, et al., "Crystallinity Evaluation in Low-Temperature-Poly-Silicon TFT Manufacturing Process—Application of Lifetime Measurement", R&D Kobe Steel Engineering Reports, vol. 57, No. 1, pp. 8-16, (2007).

International Search Report and Written Opinion of the International Searching Authority dated Apr. 15, 2014 in PCT/JP14/050177 Filed Jan. 9, 2014.

Extended European Search Report dated Jun. 30, 2016 in Patent Application No. 14738131.3.

Thomas Martin, et al., "Life-Stress Relationship for Thin Film Transistor Gate Line Interconnects on Flexible Substrates," Semiconductor Device Research Symposium, XP031919922, Dec. 9-11, 2009, 2 pages.

Tom Lee, et al., "Characterization and Reliability of TaN Thin Film Resistors," Reliability Physics Symposium Proceedings, XP010710916, 2004, pp. 502-508.

E. Fortunato et al., "Oxide Semiconductor Thin-Film Transistors: A Review of Recent Advances," Advanced Materials, XP055282939, 2012, vol. 24, No. 22, pp. 2945-2986.

* cited by examiner

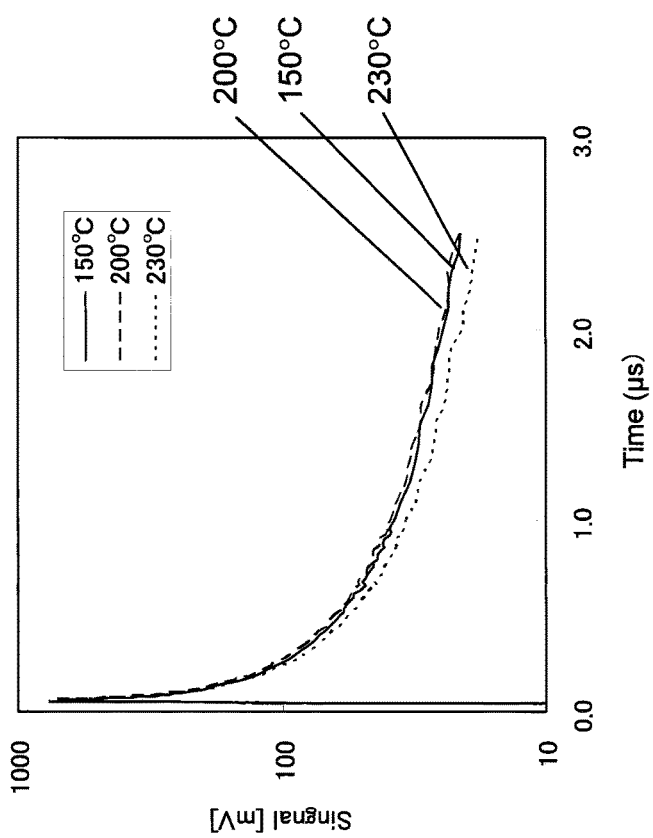

EVALUATION METHOD FOR OXIDE SEMICONDUCTOR THIN FILM, QUALITY CONTROL METHOD FOR OXIDE SEMICONDUCTOR THIN FILM, AND EVALUATION ELEMENT AND EVALUATION DEVICE USED IN THE EVALUATION METHOD

FIELD OF TECHNOLOGY

The present invention relates to an evaluation method and a quality control method for an oxide for a semiconductor layer (an oxide semiconductor thin film) in a thin film transistor (TFT) used in display devices such as liquid crystal displays and organic EL displays; an evaluation element and an evaluation device used in the evaluation method. Specifically, the present invention relates to a technology for judging and evaluating stress stability of an oxide semiconductor thin film in a non-destructive and contactless manner.

BACKGROUND ART

As compared with widely used amorphous silicon (a-Si), amorphous (non-crystalline), oxide semiconductors have high carrier mobility, a wide optical band gap, and film formability at low temperatures, and therefore, have highly been expected to be applied for next generation displays, which are required to have large sizes, high resolution, and high-speed drives; resin substrates having low heat resistance; and others.

Among the oxide semiconductors, an amorphous oxide semiconductor consisting of indium (In), gallium (Ga), zinc (Zn) and oxygen (In—Ga—Zn—O, which may hereinafter be referred to as "IGZO") has been preferably used in particular because of its extremely high carrier mobility. For example, Non-patent Literature Documents 1 and 2 disclose thin film transistors in which a thin film of oxide semiconductor having an In:Ga:Zn ratio equal to 1.1:1.1:0.9 (atomic % ratio) was used as a semiconductor layer (active layer). Patent Document 1 discloses an amorphous oxide containing elements such as In, Zn, Sn, Ga, and Mo, in which atomic ratio of Mo relative to total metal atomic contents in the amorphous oxide is 0.1 to 5 atomic %. Disclosed in an example is a TFT in which an active layer comprising Mo-added IGZO was used.

Properties of the oxide semiconductors are, however, known to vary depending on various deviations in the course of film formation process and subsequent heat treatment. For example, TFT characteristics are liable to deviate by significant change of carrier concentrations, a dominant factor of TFT characteristics, caused by lattice defects and hydrogen in the film generated in the course of the film formation process. It is thus essential from the point of view to improving the productivity to evaluate properties of deposited oxide semiconductor thin films, to feedback the results of the evaluation, to adjust manufacturing conditions, and to control film quality in the manufacturing process of the display devices or the like.

In a conventional evaluation method for an oxide semiconductor thin film, a gate insulator film or a passivation insulator film and contact electrodes are usually formed on the oxide semiconductor thin film, then the Hall effect is evaluated, and characteristics such as mobility and threshold voltage are measured. It takes, however, time and cost to form contact electrodes in such a contacting type evaluation method. Formation of the contact electrodes is also liable to induce additional defects in the oxide semiconductor thin film. It is thus required to establish a contactless-type evaluation method in which formation of contact electrodes is not necessary from the point of view to improving fabrication yield.

Therefore, microwave photo conductivity decay method, a method to quantitatively or qualitatively evaluate mobility of an oxide semiconductor thin film is disclosed as a method to control film quality of an oxide semiconductor thin film in a contactless manner without forming contact electrodes in Patent Document 2.

It is also required for a TFT adopting an oxide semiconductor thin film to be excellent in terms of not only the mobility but also resistance to stress (stress stability) such as light irradiation and voltage application. Here, the stress stability is defined that threshold voltage ($V_{th}$) shift is not observed, meaning a small amount of the threshold voltage shift ($\Delta V_{th}$) before and after applying the stresses, in drain current-gate voltage characteristics (I-V characteristics) even a semiconductor elements such as a transistor is subjected to continuous stresses such as holding light irradiation and continuously applying gate voltage.

In an organic EL display, for example, positive biasing is kept applying onto a gate electrode of a driving TFT while an organic EL element emits light. When a voltage is applied to the gate electrode, electric charges are trapped on the boundary between the gate insulator film and the semiconductor layer, resulting in a problem of variation of $V_{th}$ and the switching characteristics. Such a variation of the switching characteristics of the TFT caused by the stress deteriorates the reliability of display devices such as a liquid crystal display and an organic EL display. Therefore, an improvement in the stress stability is eagerly desired.

The evaluation of the stress stability is also preferably conducted in a contactless and simple manner as for the mobility because the stability is dependent of film quality of an oxide semiconductor thin film. However, there has been a problem that actual measurement must have been conducted under applying the stress for an extended period of time after the formation of contact electrodes.

PRIOR ART DOCUMENTS

Patent Document

Patent Document 1: Japanese Patent Laid-open Publication No. 2009-164393
Patent Document 2: Japanese Patent Laid-open Publication No. 2012-33857

Non-Patent Literature Document

Non-patent Literature Document 1: Kotaibutsuri (Solid State Physics), Vol. 44, p. 621 (2009)
Non-patent Literature Document 2: Nature, Vol. 432, p. 488 (2004)

SUMMARY OF THE INVENTION

Problems to be Solved by the Invention

The present invention has been made under the circumstances described above, and one object of the present invention is to provide a method to accurately and easily measure and evaluate (predict or estimate) stress stability (amount of threshold voltage shift $\Delta V_{th}$ caused by the stress)

of a TFT comprising an oxide semiconductor thin film in a contactless manner; and a quality control method for an oxide semiconductor.

Another object of the present invention is to provide an evaluation element and an evaluation device to be used in the evaluation method.

Means for Solving the Problems

An evaluation method for an oxide semiconductor thin film according to the present invention, which can solve the above-mentioned problems, is including a first step comprising; irradiating both excitation light and microwave radiation to a specimen on which an oxide semiconductor thin film is formed, measuring the maximum intensity of reflected wave of the microwave radiation, which varies with the irradiation of the excitation light, from the oxide semiconductor thin film, then stopping the irradiation of the excitation light, and thereafter measuring a variation in the reflectance with time of the microwave radiation reflected by the oxide semiconductor thin film after the stopping, and a second step comprising; calculating, from the variation in the reflectance, a parameter that corresponds to slow attenuation observed about 1 μs after the stopping, and evaluating the stress stability of the oxide semiconductor thin film.

In a preferred embodiment of the present invention, the stress stability of the oxide semiconductor thin film is evaluated in the second step by both the parameter corresponding to the slow attenuation of the reflectance of the microwave radiation observed about 1 μs after stopping of the excitation light and the maximum intensity of reflectance of the microwave radiation.

In a preferred embodiment of the present invention, the parameter is a lifetime value.

In a preferred embodiment of the present invention, the oxide semiconductor thin film comprises one or more kinds of element selected from a group consisting of In, Ga, Zn, and Sn.

In a preferred embodiment of the present invention, the oxide semiconductor thin film is deposited on a surface of a gate insulator film.

In a preferred embodiment of the present invention, the oxide semiconductor thin film has a passivation film on the surface.

The quality control method for an oxide semiconductor thin film according to the present invention, which can solve the above-mentioned problems, is the evaluation method is applied to any of manufacturing processes of the semiconductor.

The present invention also encompasses a quality control apparatus for an oxide semiconductor thin film in which the quality control method is used in any of manufacturing processes of the TFT having the oxide semiconductor.

Further, an evaluation element according to the present invention, which can solve the above-mentioned problems, is comprising an oxide semiconductor thin film on a substrate which is used for any of the evaluation methods.

In a preferred embodiment of the present invention, the oxide semiconductor thin film is formed directly on a substrate.

In a preferred embodiment of the present invention, the oxide semiconductor thin film is formed directly on a surface of the gate insulator film.

In a preferred embodiment of the present invention, a passivation film is formed on a surface of the oxide semiconductor thin film.

The evaluation device of the present invention which was able to solve the problem comprises a plurality of the evaluation elements arrayed on a substrate.

Effects of the Invention

The stress stability (amount of threshold voltage shift $\Delta V_{th}$ caused by the stress) of an oxide semiconductor thin film can be accurately and easily evaluated, predicted or estimated, and measured in a contactless manner by the present invention.

Application of the evaluation method according to the present invention to any of manufacturing processes of a semiconductor enables quality control of the oxide semiconductor thin film during manufacturing process of the TFT.

The present invention can also provide an evaluation element and an evaluation device to be used in each of the processing steps.

BRIEF DESCRIPTION OF DRAWING

FIG. 15 are graphs showing measurement results of microwave photoconductive decay in Example 3.

FIG. 16 are graphs showing $\Delta V_{th}$ or a lifetime and deposition temperature in Example 5.

FIG. 17 is a graph showing measurement results of microwave photoconductive decay in Example 6.

FIG. 20 are graphs showing relation between the pre-annealing time and $\Delta V_{th}$ (indicated by filled circle in the figure) as well as relation between the pre-annealing time and $\tau_2$ (indicated by open triangle in the figure) in Example 8.

FIG. 21 are graphs showing results in Example 9.

MODE FOR CARRYING OUT THE INVENTION

Figure 1:
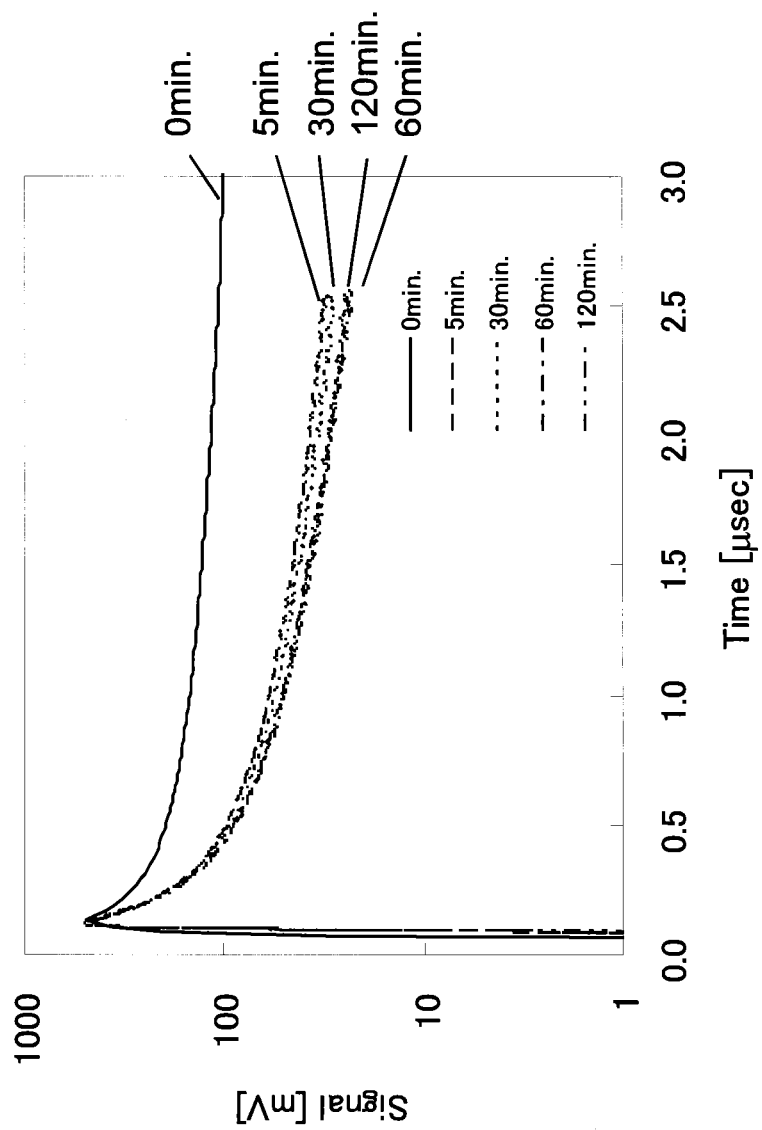
FIG. 1 is a graph showing a measurement result of microwave photoconductive decay in Example 1.

The evaluation method for an oxide semiconductor thin film include; a first step of irradiating both excitation light and microwave radiation to a specimen on which an oxide semiconductor thin film is formed, measuring the maximum intensity of reflected wave of the microwave radiation, which varies with the irradiation of the excitation light, from the oxide semiconductor thin film, then stopping the irradiation of the excitation light, and thereafter measuring a variation in the reflectance with time of the microwave radiation reflected by the oxide semiconductor thin film after the stopping, and a second step of calculating, from the variation in the reflectance, a parameter that corresponds to slow attenuation observed about 1 µs after the stopping, and evaluating the stress stability of the oxide semiconductor thin film.

The present invention thus utilizes the microwave photo conductivity decay method disclosed in the Patent Document 2. Specifically, the present invention is based on findings that a slow attenuation of microwave (amount of decay in microwave) observed about 1 µs after stopping irradiation of excitation light among microwave decays obtained by the method disclosed in the Patent Document 2 µs closely correlated with the stress stability ($\Delta V_{th}$) of an oxide semiconductor thin film and that it is a useful parameter to accurately and easily evaluate, predict or measure the stress stability in a contactless manner.

In the present specification, "the parameter corresponding to the slow attenuation observed about 1 µs after stopping the irradiation of excitation light" may be exemplified; a time until the intensity of the reflected microwave attenuates to $1/e^2$ of the maximum value; slope of log-transformed intensity decay curve of the reflected microwave in a range from $1/e$ to $1/e^2$ of the maximum value, or its absolute value of inverse of the slope; slope of decay curve of the reflected microwave in a range of about 1 µs to 2 µs after stopping irradiation of the excitation light, or its absolute value of inverse of the slope; intensity of the reflected microwave observed about 1 µs after stopping irradiation of the excitation light; when decay of reflected microwave is represented by a sum of two exponential function, a value of longer slope of the log-transformed function, or its absolute value of inverse of the slope. "When decay of reflected microwave is represented by a sum of two exponential functions, slope of the log-transformed function" means, for example, $\tau_1$ and $\tau_2$ in expressions (1) and (2) in Example 8 explained below. In Example 8, "when decay of reflected microwave is represented by a sum of two exponential functions, a value of longer slope of the log-transformed function" means $\tau_2$.

Among the parameters, slope of log-transformed intensity decay curve of the reflected microwave in a specific range and its absolute value of inverse of the slope are preferred. Particularly preferred parameters are; slope of log-transformed intensity decay curve of the reflected microwave in a range from $1/e$ to $1/e^2$ of the maximum value, or its absolute value of inverse of the slope; and slope of decay curve of the reflected microwave in a range of about 1 µs to 2 µs after stopping irradiation of the excitation light, or its absolute value of inverse of the slope.

All of the particularly preferable parameters are defined as the lifetime values in the present specification. In Examples 1 to 9 described below, lifetime values derived as shown below were used as "the parameters corresponding to the slow attenuation observed about 1 µs after stopping of the excitation light". In Examples 1 to 7, evaluation 1 in Example 8, and evaluation 1 in Example 9: inverse of slope of log-transformed intensity decay curve of the reflected microwave in a range from $1/e$ to $1/e^2$ of the maximum value (simply referred to "lifetime value" in these Examples).

In evaluation 2 of Example 8: Lifetime value $\tau_2$ derived by way of parameter fitting to the expression (1) representing the reflectance of the microwave.

In evaluation 3 of Example 8: Lifetime value $\tau_2$ derived by way of parameter fitting to the expression (2) representing the reflectance of the microwave.

In evaluation 2 of Example 9: Lifetime value derived by way of parameter fitting to the expression (3) representing the reflectance of the microwave. The lifetime value is referred to as parameter B for the purpose of distinguishing it from other lifetime values here.

In evaluation 3 of Example 9: Lifetime value derived by way of parameter fitting to the expression (4) representing the reflectance of the microwave. The lifetime value is referred to as parameter C for the purpose of distinguishing it from other lifetime values here.

It is noted here that the expression "about 1 µs" in the parameters is not meant to strictly limit them to 1 µs but meant to include a range of the microwave reflectance of the slow attenuation of reflectance (small slope of the curve) after stopping the irradiation of the excitation light. It is thus difficult to univocally specify the time. Typical ranges of the time are, for example, 0.5 µs to 1 µs, 0.5 µs to 1.5 µs, and 1 µs to 2 µs.

The evaluation method according to the present invention is explained in detail hereinbelow. An apparatus used for the present invention is, for example, a lifetime measurement apparatus shown in FIG. 1 of the Patent Document 2. Detailed disclosure on the apparatus in the Patent Document 2 may be referred. An evaluation method based on a lifetime value is explained hereinbelow. The present invention is, however, not limited to the evaluation method.

First, a specimen having an oxide semiconductor thin film is prepared.

An amorphous oxide semiconductor comprising one or more kinds of element selected from a group consisting of In, Ga, Zn, and Sn is preferably used for the oxide semiconductor thin film. These elements may be contained alone, or two or more kinds thereof may be used in combination. Specifically, examples of the semiconductor include oxides such as In oxide, In—Sn oxide, In—Zn oxide, In—Sn—Zn oxide, In—Ga oxide, Zn—Ga oxide, In—Ga—Zn oxide, and Zn oxide.

Thickness of the oxide semiconductor film is preferably controlled to a range, for example, from a few tens of nanometers to about 500 nm. Upper limit of the thickness is more preferably smaller than or equal to 200 nm, and even more preferably smaller than or equal to 100 nm. Lower limit of the thickness is more preferably larger than or equal to 10 nm, and even more preferably larger than or equal to 30 nm.

The specimens to be used in the present invention is comprising an oxide semiconductor thin film on a substrate. Various kinds of substrates usually used in the technological field of the present invention may be adopted for the substrate. For example, glass substrates for liquid crystal display devices having a thickness of about 0.7 mm and a size (an area) of several tens of square centimeters to more than a few square meters called the first generation to the tenth generation may be used.

Excitation light and microwave radiation are irradiated on these specimens.

When the oxide semiconductor thin film specimen is subjected to irradiation of an excitation light, the energy is absorbed to the oxide semiconductor thin film and excess carriers (excitation carriers) are generated. As the density of the excess carriers increases, the rate of disappearance also increases. When the carrier injection rate becomes equal to the disappearance rate, the density of excess carriers reaches to a constant peak value. When the generation and the annihilation rates of the excess carriers become equal to each other, the density of excess carriers becomes saturated and maintains a constant value. It is known that when the irradiation of the excitation light is stopped in that state, the excess carriers decrease by way of their recombination and annihilation, and that a density of carriers is eventually restored to a value prior to the irradiation of the excitation light.

It is supposed that the stress stability of an oxide semiconductor thin film can be evaluated by measuring the lifetime value by using the microwave photo conductivity decay method based on the mechanism shown hereinbelow.

The microwave irradiated onto an oxide semiconductor thin film is reflected at a reflectance based on a resistivity determined by the density of free carriers in the oxide semiconductor thin film. As the resistivity of the oxide semiconductor thin film decreases upon the irradiation of the excitation light which generates excess carriers, the microwave reflectance increases. On the other hand, when the irradiation of the excitation light is stopped, the resistivity increases as the numbers of the excess carriers decrease, and the reflectance of the microwave decreases.

It is noted here that while the intensity of the reflected microwave is influenced by the excess carriers generated in the measuring portion by the irradiation of the excitation light, the degree of the influence depends also on density of defects in the specimen. The intensity of the microwave irradiated to and reflected by an oxide semiconductor thin film temporary increases by the irradiation of the excitation light and then attenuates. While excess carriers decrease by way of a recombination process, in a specimen having high density of defects, the excess carriers are trapped in the defects and prevented from recombination. As a result, the lifetime value increases. On the other hand, the stress stability is also influenced by the trapped carriers. When the lifetime values are increased, the stress stability is deteriorated and $\Delta V_{th}$ is increased.

Accordingly, the stress stability of an oxide semiconductor thin film can be evaluated by irradiating both excitation light and microwave radiation to a specimen on which an oxide semiconductor thin film is formed, measuring the maximum intensity (peak value) of reflected wave of the microwave radiation, which varies with the irradiation of the excitation light, from the oxide semiconductor thin film, then stopping the irradiation of the excitation light, and thereafter measuring a variation in the reflectance with time of the microwave radiation reflected by the oxide semiconductor thin film after the stopping, calculating lifetime values from the measured values, it is possible to evaluate the stress stability of the oxide semiconductor thin film.

The evaluation method for an oxide semiconductor thin film according to the present invention is described in detail hereinabove.

The present invention includes a quality control method for an oxide semiconductor thin film by applying the evaluation method to any of manufacturing processes of a semiconductor. By applying the evaluation method to any of the manufacturing processes, it becomes possible to feedback the results of evaluation of electrical properties (stress stability) of the oxide semiconductor thin film and to control the film quality by way of adjusting the manufacturing conditions. Quality control of the oxide semiconductor can be appropriately conducted, accordingly.

The "any of the manufacturing processes" in the last paragraph means any processes in the course of manufacturing semiconductor. According to results of investigation by the present inventors, it has been conceived that the manufacturing processes that affect to the stress stability include (i) deposition process of the gate insulator film, (ii) deposition process of the oxide semiconductor thin film, (iii) heat treatment (pre-annealing) process after the deposition of the oxide semiconductor thin film, and (iv) deposition process of a passivation film which could be formed on the surface of the oxide semiconductor thin film. By applying the evaluation method to these processes, for example, quality of the oxide semiconductor thin film can be accurately controlled.

The passivation film (passivation insulator film) includes both an etch stopper layer to directly protect a surface an oxide semiconductor thin film and a final passivation film to further protect a surface of the passivation film (refer FIG. 8 described below).

Specifically, for example, the evaluation method may be performed immediately after forming the oxide semiconductor thin film, after a formation of a gate insulator film or without the formation of a gate insulator film and directly, on a substrate. Alternatively, the evaluation method may be performed for an oxide semiconductor film formed on a substrate or on a gate insulator film after a heat treatment (pre-annealing treatment) in, for example, an oxygen or water vapor atmosphere. Further alternatively, the evaluation method may be performed before the formation of a passivation film (passivation insulator film). Moreover, the evaluation method may be performed in a single processing step or more than one processing steps in the course of manufacturing. By adopting the evaluation method of the present invention in more than one process as in the latter case, in-plane distribution of an oxide semiconductor thin film (in-plane variation of $V_{th}$) can be evaluated.

The evaluation method according to the present invention may be applicable when, for example, an oxide semiconductor thin film is formed on a substrate; an oxide semiconductor thin film is formed after a formation of a gate insulator film; a heat treatment (pre-annealing) is conducted after a formation of an oxide semiconductor thin film. A gate insulator film may be formed prior to the formation of the oxide semiconductor thin film in this case. Alternatively, formation of a gate insulator film may be skipped. Further alternatively, the evaluation method may be applicable when a passivation film, including a final passivation film to further protect the passivation film, is formed on the oxide semiconductor thin film after any of the aforementioned processes. Even further alternatively, the evaluation method may be applicable when a heat treatment (referred to as post-anneal in contrast to the above-described pre-annealing) is conducted after the formation of the passivation film.

By using the evaluation method according to the present invention, stress stability of oxide semiconductor thin films having various compositions and concentrations can be easily evaluated in a short period of time at low cost in a material development stage of an oxide semiconductor thin film. Further, by applying the evaluation method according to the present invention to a production line for a liquid crystal display device or the like, electrical properties of an oxide semiconductor thin film can be evaluated in-line in a short period of time in a contactless manner. The productivity such as production yield can be improved and quality control of an oxide semiconductor thin film can be appropriately executed.

The present invention also includes an evaluation element which is used in any of the evaluation methods. The evaluation element comprises an oxide semiconductor thin film formed on a substrate and a structure corresponding to any of the processes represented by the processes (i) to (iv).

Specifically, exemplified as the evaluation element include those in which; (a) an oxide semiconductor thin film is formed directly on a surface of a substrate; (b) an oxide semiconductor thin film is formed directly on a surface of a gate insulator film; (c) a passivation film is formed on a surface of the oxide semiconductor thin film of (a) or (b). The passivation film includes the etch stopper layer and the final passivation layer shown in FIG. 8.

It is essential for the evaluation element according to the present invention to comprise an oxide semiconductor thin film formed directly on the surface of either the substrate or the gate insulator film as described in (a) or (b). In other words, there is no metal electrode such as a gate electrode directly below the oxide semiconductor thin film. If there is a gate electrode or the like immediately below the oxide semiconductor thin film, influence of the gate electrode to the reflectance of the microwave becomes dominant as the gate electrode has high density of free carriers (electrons) of $10^{18}$ cm$^{-3}$ or larger.

Examples of configurations of the evaluation element according to the present invention are shown in FIGS. 5 to 8, 12 to 14. As shown in FIGS. 5 to 8, a metal electrode is not disposed directly beneath the oxide semiconductor thin film.

Figure 5:
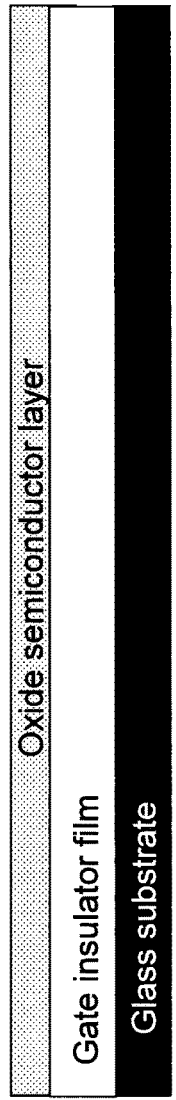
FIG. 5 is a schematic showing an example of evaluation element according to the present invention.

Among these, FIG. 5, for example, shows a configuration in which a gate insulator film and an oxide semiconductor layer are formed in this order on a substrate such as a glass substrate, and corresponds to specimen 1 for lifetime measurement (without patterning of the oxide semiconductor thin film) fabricated in Example 2 described below.

Figure 6:
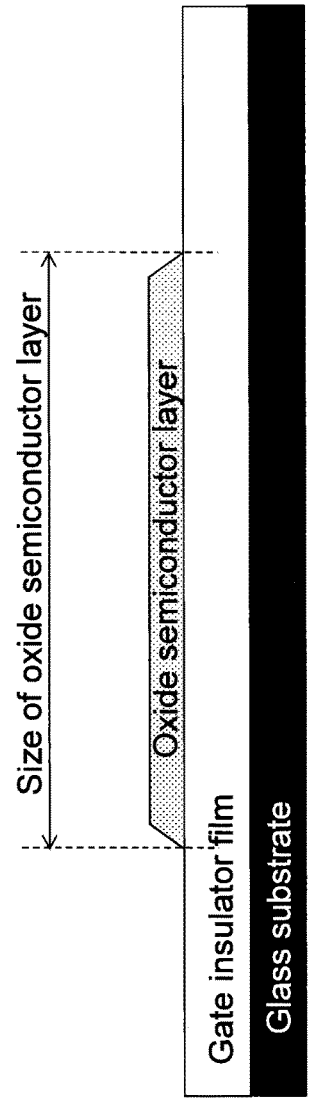
FIG. 6 is a schematic showing another example of evaluation element according to the present invention and corresponds to evaluation element 1 in Example 3.

FIG. 6 shows a configuration in which an oxide semiconductor layer is patterned after a gate insulator film and the oxide semiconductor layer are formed in this order on a substrate such as a glass substrate, and corresponds to evaluation element 1 for lifetime measurement fabricated in Example 3 described below.

Figure 7:
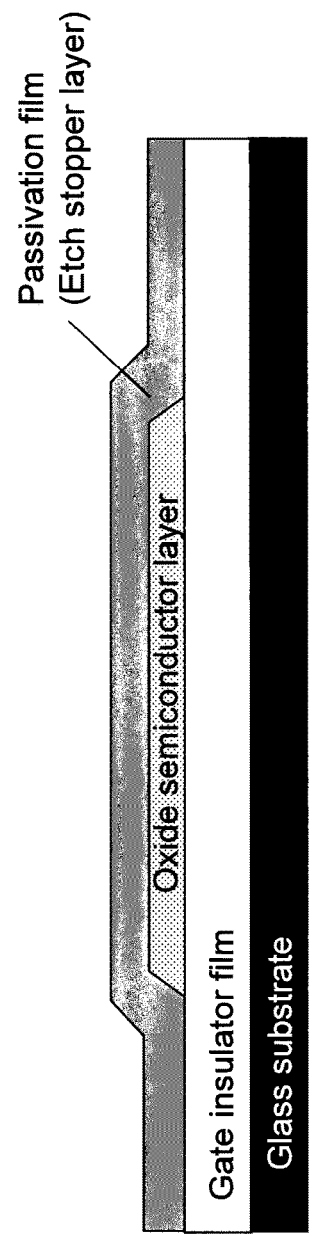
FIG. 7 is a schematic showing another example of evaluation element according to the present invention and corresponds to evaluation element 2 in Example 3.

FIG. 7 shows a configuration in which a gate insulator film, a patterned oxide semiconductor layer, and a patterned passivation film (an etch stopper layer) are formed in this order on a substrate such as a glass substrate, and corresponds to evaluation element 2 in Example 3 described below.

Figure 8:
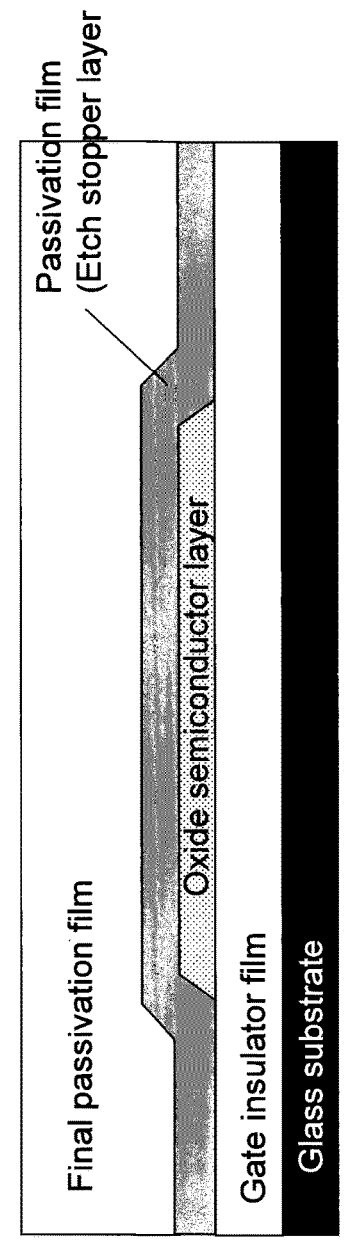
FIG. 8 is a schematic showing another example of evaluation element according to the present invention and corresponds to evaluation element 3 in Example 3.

FIG. 8 shows a configuration in which a gate insulator film, a patterned oxide semiconductor layer, a patterned passivation film (an etch stopper layer), and a final passivation film are formed in this order on a substrate such as a glass substrate, and corresponds to evaluation element 3 in Example 3 described below.

Figure 12:
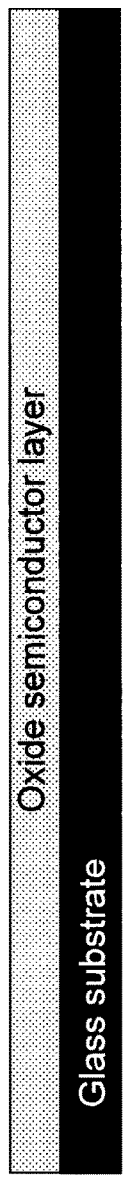
FIG. 12 is a schematic showing another example of evaluation element according to the present invention and corresponds to an evaluation element in Examples 1 and 5.

FIG. 12 shows a configuration in which an oxide semiconductor layer is formed on a substrate such as a glass substrate, and corresponds to Examples 1 and 5 described below.

Figure 13:
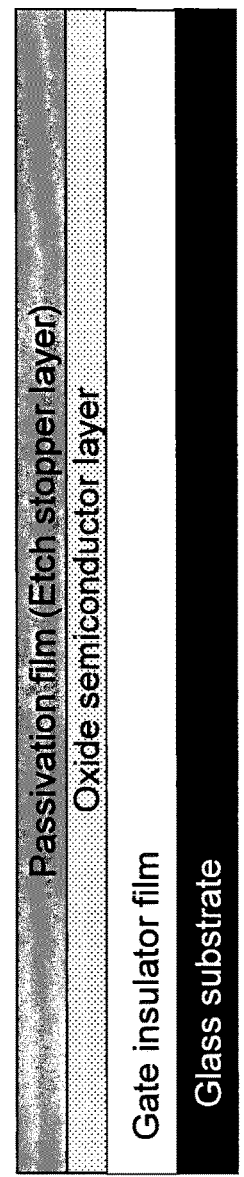
FIG. 13 is a schematic showing another example of evaluation element according to the present invention and corresponds to the evaluation element 2 in Example 4.

FIG. 13 shows a configuration in which a gate insulator film, an oxide semiconductor layer, and a passivation film (an etch stopper layer) are formed in this order on a substrate such as a glass substrate, and corresponds to evaluation element 2 in Example 4 described below.

Figure 14:
FIG. 14 is a schematic showing another example of evaluation element according to the present invention and corresponds to the evaluation element in Example 6.

FIG. 14 shows a configuration in which an oxide semiconductor layer and a passivation film (an etch stopper layer) are formed in this order on a substrate such as a glass substrate, and corresponds to Example 6 described below.

The present invention further includes an evaluation device in which a plurality of the evaluation elements described above is disposed on a substrate.

Figure 9:
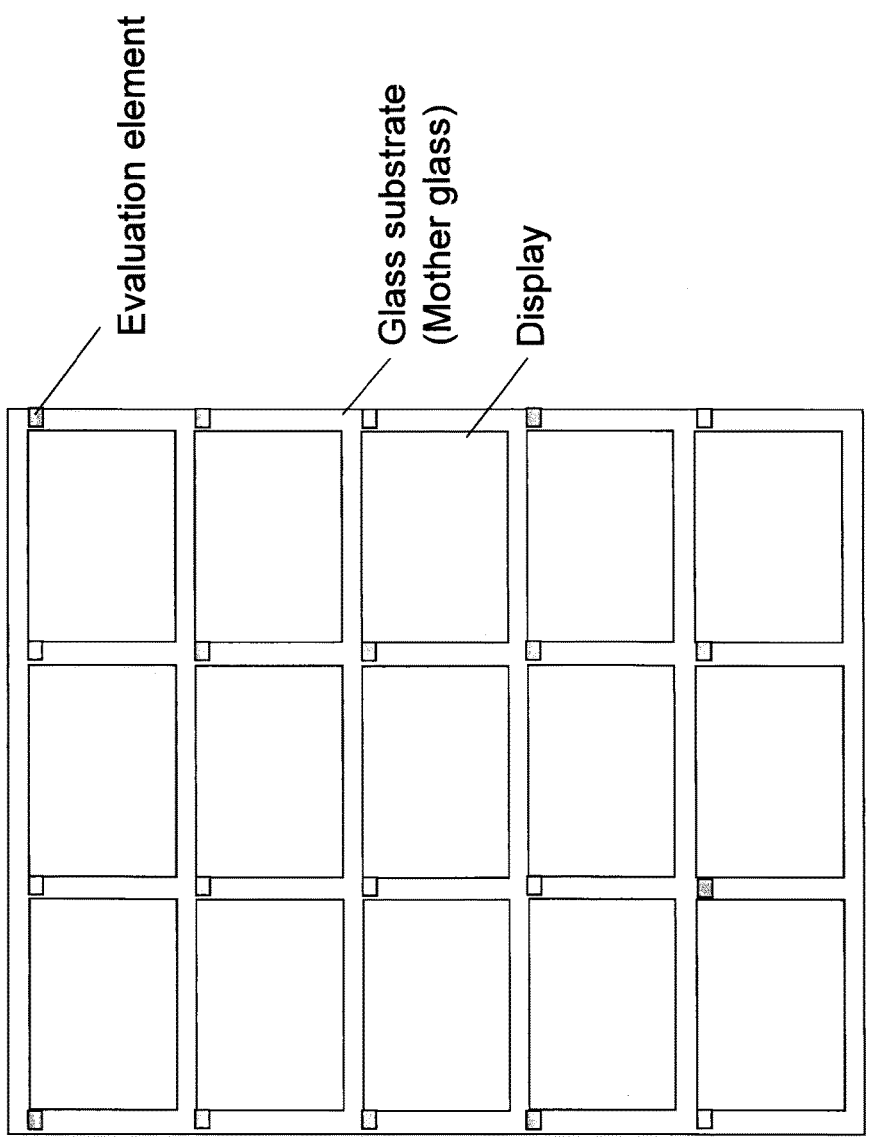
FIG. 9 is a schematic showing an example of evaluation device according to the present invention.

FIG. 9 is a schematic showing an example of the evaluation device. As shown in FIG. 9, a plurality of evaluation element is orderly arrayed on a glass substrate which is used in a mass-production line. By using the evaluation device, quality control of an oxide semiconductor thin film such as in-plane distribution (in-plane deviation of $V_{th}$) and inter-substrate distribution (variation of $V_{th}$ among different glass substrates) may be evaluated The present application claims the benefit of priority based on Japanese Patent Applications No. 2013-004061, No. 2013-065193, and No. 2013-250627 filed on Jan. 11, 2013, Mar. 26, 2013, and Dec. 3, 2013, respectively. The entire contents of the specification of the Japanese Patent Applications No. 2013-004061, No. 2013-065193, and No. 2013-250627 filed on Jan. 11, 2013, Mar. 26, 2013, and Dec. 3, 2013, respectively, are incorporated herein by reference.

EXAMPLES

The present invention is described hereinafter more specifically by way of Examples, but the present invention is not limited to the following Examples. The present invention can be put into practice after appropriate modifications or variations within a range meeting the gist described above and below, all of which are included in the technical scope of the present invention.

Example 1

Experiments were conducted in Example 1 as described below in order to evaluate correlation between lifetime value of an oxide semiconductor thin film (InGaZnO, IGZO herein) calculated based on microwave photo conductivity decay and stress stability $\Delta V_{th}$. Lifetime values were derived in the present example and Examples 2 to 7 described below as inverse of slope of log-transformed intensity decay curve of reflected wave in a range from 1/e to 1/e$^2$ of the maximum value of the microwave reflection intensity.

(1) Preparation of a Specimen for Measuring Lifetime Value

Firstly, an oxide semiconductor layer (IGZO) was formed on a glass substrate ("EAGLE XG" available from Corning Incorporated, having a diameter of 100 mm and a thickness of 0.7 mm) by a sputtering method under the following conditions.

Sputtering apparatus: "CS-200" available from ULVAC, Inc.

Composition of the sputtering target: InGaZnO4 [In:Ga:Zn=1:1:1 (in atomic ratio)]

Substrate temperature: room temperature

Film thickness of the oxide semiconductor layer: 40 nm

Addition amount of oxygen: $O_2/(Ar+O_2)$=4% (in volume ratio)

Gas pressure: 1 mTorr

Then a pre-annealing treatment was carried out at 350° C. under air atmosphere for 60 minutes for the purpose of changing $\Delta V_{th}$ of the oxide semiconductor thin film, specimens were prepared under various conditions (various pre-annealing time herein) of the pre-annealing treatment. Specifically, various specimens were prepared by changing pre-annealing time at 350° C. in a range from 0 to 120 minutes as shown in Table 1 while fixing conditions (350° C. in air under atmospheric pressure) other than the pre-annealing time.

For each of the specimens thus obtained, lifetime measurements based on the microwave photo conductivity decay were conducted. Specifically, the microwave photo conductivity decay method was carried out using a device of such configuration as shown in FIG. 1 in the Patent Document 2 under the following conditions, and change of the reflectivity was observed.

Wavelength of laser: 349 nm (UV light)

Pulse width: 15 ns

Pulse energy: 1 µJ/pulse

Beam diameter: 1.5 mmø

Number of pulse per measurement: 64 shots

Apparatus: LTA-1820SP available from KOBELCO Research Institute, Inc.

Result of the measurement based on the microwave photo conductivity decay is shown in FIG. 1. Vertical axis of FIG. 1 is intensity of reflection of microwave (in signal).

Moreover, peak value, that is a largest value of reflected microwave from the oxide semiconductor thin film, and lifetime value for each of the evaluation elements obtained by analyses of the curves depicted in FIG. 1 are shown in Table 1.

TABLE 1

| Annealing time (min.) | Peak value (mV) | Lifetime value (µs) |
|---|---|---|
| 0 | 487 | 0.541 |
| 5 | 445 | 0.153 |
| 30 | 491 | 0.131 |
| 60 | 488 | 0.126 |
| 120 | 440 | 0.131 |

It was elucidated from these results that the lifetime values decrease as the annealing time increases from 0 to 60 minutes, presumably due to decrease of defects and carrier trapping in the oxide semiconductor thin film. On the other hand, when the annealing time extended to 120 minutes, the lifetime value increased because defects were increased in the film from which Zn atoms were freed.

Figure 2:
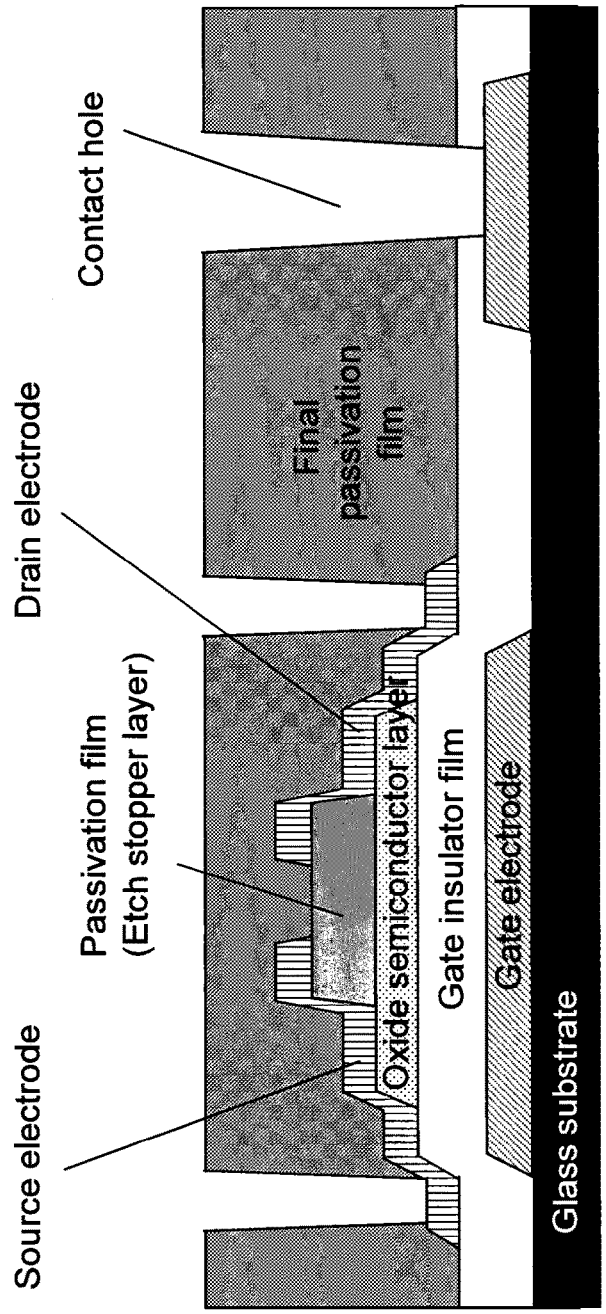
FIG. 2 is a schematic showing a structure of an oxide semiconductor TFT used in Examples 1 and 2.

(2) Preparation of a TFT Specimen for Evaluating TFT Characteristics and Stress Stability In order to confirm TFT characteristics of the specimen prepared in (1), a TFT was prepared as shown in FIG. 2 and its TFT characteristics and stress stability were evaluated.

First, a Mo thin film of 100 nm in thickness as a gate electrode and $SiO_2$ film of 200 nm in thickness as a gate insulator film were successively deposited on a glass substrate ("EAGLE 2000" available from Corning Inc, having a diameter of 100 mm and a thickness of 0.7 mm). The gate electrode was deposited using a pure Mo sputtering target by a DC sputtering method under the conditions: deposition temperature, room temperature; gas pressure, 2 mTorr. Further, the gate insulator film was formed by a plasma CVD method under the conditions: carrier gas, a mixed gas of $SiH_4$ and $N_2O$ ($N_2O$=100 sccm, $SiH_4$=4 sccm, and $N_2$=36 sccm); plasma power, 300 W; deposition temperature, 320° C.

Next, an oxide semiconductor layer was formed by a sputtering method. Adopted for the oxide thin film was IGZO with atomic ratio of In:Ga:Zn=1:1:1. The apparatus used in the sputtering was "CS-200" available from ULVAC, Inc., and the sputtering conditions were as follows.

Substrate temperature: room temperature

Gas pressure: 1 mTorr

Oxygen partial pressure: $O_2/(Ar+O_2)$=4%

Film thickness: 40 nm

After the oxide semiconductor film was deposited as described above, patterning was carried out by photolithography and wet etching. "ITO-07N" available from Kanto Chemical Co., Inc. was used for the wet etching.

After patterning of each oxide semiconductor layer as described above, pre-annealing treatment was carried out to improve the film quality. The pre-annealing was carried out at 350° C. in 100% oxygen atmosphere under atmospheric pressure for 0 to 120 minutes.

Then, a source-drain electrode was formed using pure Mo by DC sputtering method followed by patterning. The film thickness was 100 nm. The deposition method and the patterning method were the same as that for the gate electrode. For each TFT, the channel length was set to 10 µm and the channel width was set to 200

After the source-drain electrode was formed as described above, a passivation layer to protect an oxide semiconductor layer was formed thereon. A layered film having the total thickness of 400 nm consisting of $SiO_2$ having a thickness of 200 nm and SiN having a thickness of 200 nm was used as the passivation layer. The formation of the $SiO_2$ and SiN films described above was carried out by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film, and a mixed gas of $SiH_4$, $N_2$ and $NH_3$ was used for the formation of the SiN film. In both cases, the film formation power was set to 100 W and the film formation temperature was set to 150° C.

Then, a contact hole to be used for probing to evaluate transistor characteristics was formed in the passivation layer by photolithography and dry etching to obtain a TFT.

For each of the TFTs thus obtained, (A) transistor characteristics [drain current ($I_d$)-gate voltage ($V_g$) characteristics] and (B) variation of the threshold voltage ($\Delta V_{th}$) were evaluated before and after applying the stress as explained below.

(A) Measurement of Transistor Characteristics

A semiconductor parameter analyzer "4156C" available from National Instruments was used for measuring the transistor characteristics. The detailed measurement conditions were as described below.

Source voltage: 0 V
Drain voltage: 10 V
Gate voltage: −30 to 30 V (measurement increment: 1 V)

(B) Evaluation of $\Delta V_{th}$ as the Stress Stability (Light Irradiation while Applying Negative Bias as the Stress)

In the present example, stress application tests were carried out by light irradiation while applying negative bias to the gate electrode for simulation of environments (stress) at the time of actual panel drive. The stress application conditions were as described below. As the wavelength of light, about 400 nm was selected, which is near the band gaps of oxide semiconductors and at which transistor characteristics may easily vary.

Gate voltage: −20 V
Substrate temperature: 60° C.
Light stress:
  Light source: white light source
  Illuminance (intensity of light irradiated onto TFTs): 25,000 NIT
  Irradiation device: YSM-1410 available from Yang Electronic Systems Co., Ltd.
  Stress application time: 2 hours Here, the threshold voltage is, roughly speaking, a value of the gate voltage when the transistor is shifted from the off-state (the state where the drain current $I_d$ is low) to the on-state (the state where the drain current is high). In this example, the voltage when the drain current is around 1 nA between the on-state current and the off-state current was defined as the threshold voltage, and variation of the threshold voltage (the amount of shift, $\Delta V_{th}$) was measured before and after applying the stress. A TFT having smaller $\Delta V_{th}$ is considered superior in terms of the stress stability.

Figure 3:
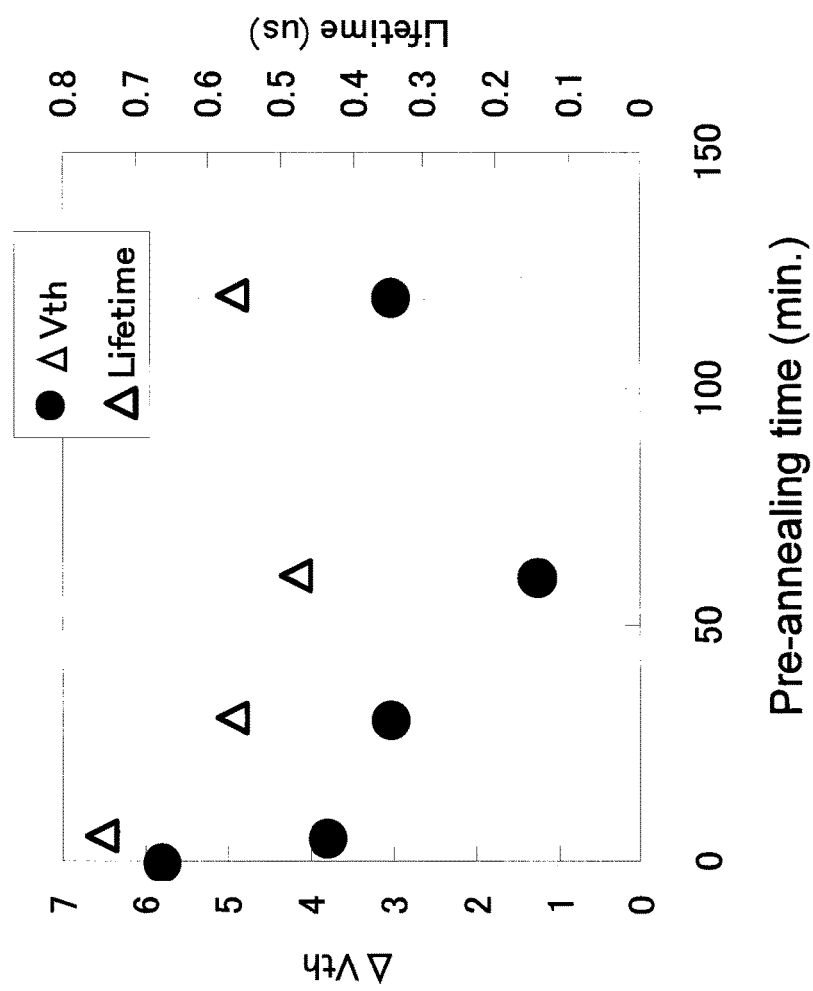
FIG. 3 is a graph showing $\Delta V_{th}$ or a lifetime and pre-annealing time in Example 1.

Relations between the pre-annealing time and $\Delta V_{th}$ as well as the pre-annealing time and lifetime values are shown in FIG. 3. In FIG. 3, the $\Delta V_{th}$ and the lifetime values are indicated by filled circle and open triangle, respectively.

The relations showed a similar profile to each other as evident in FIG. 3, elucidating behaviors of the $\Delta V_{th}$ and the lifetime values are in accord. It was thus demonstrated that the stress stability of the TFT can be indirectly but accurately evaluated by the evaluation method based on the lifetime values according to the present invention.

Example 2

Following experiments were carried out in the present example in order to examine whether it is possible to evaluate stress stability by the evaluation method according to the present invention in a process of depositing an oxide semiconductor thin film after forming a gate insulator film. Specifically, various specimens were prepared by changing hydrogen concentration in a gate insulator film and gas pressure in the course of depositing an oxide semiconductor thin film for the purpose of varying $\Delta V_{th}$ of the oxide semiconductor thin films.

(1) Fabrication of Specimens for Measuring Lifetime Value

First, as a gate insulator film having different amount of hydrogen, (A) a $SiO_2$ laminate of double-layered structure and (B) a $SiO_2$/SiN laminate of three-layered structure were deposited by using a plasma CVD method on a glass substrate ("EAGLE 2000" available from Corning Inc, having a diameter of 100 mm and a thickness of 0.7 mm). Specific deposition conditions of each of the gate insulator films were as follows.

(A) $SiO_2$ Laminate of Double-Layered Structure Having 1.2 Atomic % Hydrogen

The first layer: $SiO_2$ layer on a side of the gate insulator film
  Carrier gas: $N_2O$=100 sccm, $SiH_4$=6 sccm, and $N_2$=54 sccm
  Gas pressure: 133 Pa
  Plasma power: 100 W
  Deposition temperature: 320° C.
  Film thickness: 150 nm The second layer: $SiO_2$ layer on a side of the semiconductor
  Carrier gas: $N_2O$=100 sccm, $SiH_4$=2.2 sccm, and $N_2$=19.8 sccm
  Gas pressure: 200 Pa
  Plasma power: 300 W
  Deposition temperature: 320° C.
  Film thickness: 100 nm (B) $SiO_2$/SiN Laminate of Three-Layered Structure Having 4.3 Atomic % Hydrogen The first layer: SiN layer on a side of the gate insulator film
  Carrier gas: $NH_3$=100 sccm, $SiH_4$=30.4 sccm, and $N_2$=321.6 sccm
  Gas pressure: 200 Pa
  Plasma power: 100 W
  Deposition temperature: 320° C.
  Film thickness: 350 nm The second layer: SiN layer in the middle
  Carrier gas: $NH_3$=100 sccm, $SiH_4$=22 sccm, and $N_2$=677 sccm
  Gas pressure: 160 Pa
  Plasma power: 100 W
  Deposition temperature: 320° C.
  Film thickness: 50 nm The third layer: $SiO_2$ layer on a side of the semiconductor
  Carrier gas: $N_2O$=375 sccm, $SiH_4$=8.4 sccm, and $N_2$=75.6 sccm
  Gas pressure: 200 Pa
  Plasma power: 100 W
  Deposition temperature: 320° C.
  Film thickness: 50 nm Next, an oxide semiconductor thin film of IGZO was deposited by a sputtering method. Specifically, the IGZO oxide semiconductor thin film was deposited in a similar manner to (1) in Example 1 other than varying gas pressure as shown in Table 2.

Then a pre-annealing treatment was carried out at 350° C. under air atmosphere for 60 minutes to obtain specimens 1 to 3 described below.

Specimen 1: (A) $SiO_2$ laminate (two-layer) film having 1.2 atomic % hydrogen (Gas pressure was 1 mTorr during deposition of IGZO.)

Specimen 2: (B) $SiO_2$/SiN laminate (three-layer) film having 4.3 atomic % hydrogen (Gas pressure was 1 mTorr during deposition of IGZO.)

Specimen 3: (B) $SiO_2$/SiN laminate (three-layer) film having 4.3 atomic % hydrogen (Gas pressure was 5 mTorr during deposition of IGZO.)

Figure 4:
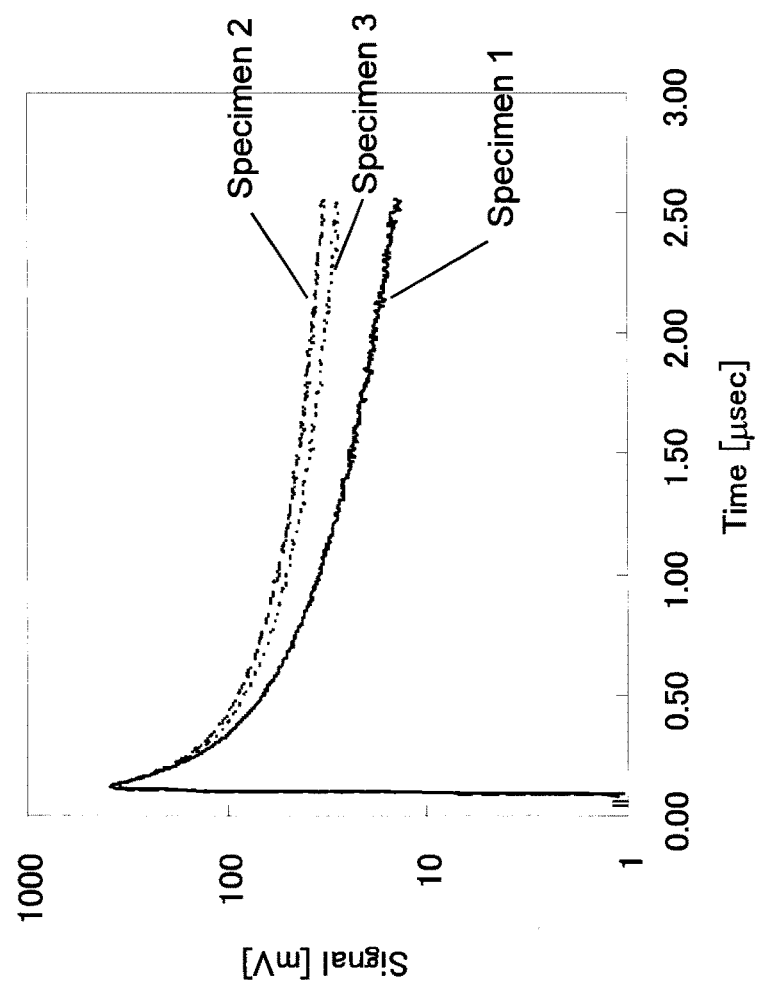
FIG. 4 is a graph showing measurement results of microwave photoconductive decay of specimens 1 to 3 in Example 2.

In a similar manner to Example 1, the microwave photo conductivity decay measurements were conducted for each of the specimens 1 to 3 next. The result is shown in FIG. 4. Vertical axis of FIG. 4 is intensity of reflection of microwave (in signal).

(2) Fabrication of TFT Specimens for Measuring the Stress Stability

A TFT having a structure depicted in FIG. 2 was fabricated in order to evaluate stress stability of the specimens 1 to 3 prepared in (1). Specifically, in order to obtain TFTs corresponding to each of the specimens 1 to 3, each of the TFT was prepared in a similar manner to Example 1 other than applying the conditions of forming the gate insulator film and the gas pressure for depositing IGZO corresponding to the specimens 1 to 3. Then respective amount of the threshold voltage shift ($\Delta V_{th}$) was measured. Results of the measurement of lifetime values and $\Delta V_{th}$ are shown in Table 2.

TABLE 2

| Specimen | Amount of hydrogen in gate insulator film (at %) | Gas pressure during formation of oxide semiconductor (mTorr) | Lifetime value (μs) | Threshold voltage shift $\Delta V_{th}$ (V) |
| --- | --- | --- | --- | --- |
| 1 | 1.2 | 1 | 0.40 | 1.75 |
| 2 | 4.3 | 1 | 1.11 | 5.25 |
| 3 | 4.3 | 5 | 0.90 | 4.00 |

From these results, it was elucidated that the lifetime value and $\Delta V_{th}$ show a similar behavior as is the case with the Example 1.

Specifically, it was found from FIG. 4 that the amount of hydrogen in the gate insulator film and the lifetime values are closely correlated with each other. Lifetime values of specimens 2 and 3 were larger than that of specimen 1 as the amount of hydrogen in specimens 2 and 3 were larger than that of specimen 1. It was also found from Table 2 that the stress stability was deteriorated when the amount of hydrogen in the gate insulator film increased and $\Delta V_{th}$ became larger. It was thus demonstrated that degradation of stress stability due to the amount of hydrogen in the gate insulator film can be clearly evaluated.

The specimens 2 and 3 may be compared as they are examples having the same amount of hydrogen in the gate insulator film while the gas pressure was different for forming the IGZO. Both lifetime value and $\Delta V_{th}$ of the specimen 3 prepared with higher gas pressure were smaller than those of the specimen 2. This is because, as the gas pressure for depositing IGZO increases, the film density decreases and density of defects increases, resulting in the larger lifetime values and deterioration of the stress stability. It was thus demonstrated that degradation of stress stability by the gas pressure for depositing IGZO can be also accurately evaluated by using the evaluation method according to the present invention.

Example 3

Following experiments were carried out in the present example in order to examine whether it is possible to evaluate stress stability by using the evaluation elements 1 to 3 shown in FIGS. 6 to 8, respectively, in each process of; depositing an oxide semiconductor thin film after forming a gate insulator film (FIG. 6); further depositing an etch stopper layer on top of the oxide semiconductor thin film (FIG. 7); and forming a final passivation on top of the etch stopper layer (FIG. 8). The evaluation element 1 in the present example 3 μs different from that in Example 2 as the oxide semiconductor thin film transistor was patterned in the former while the latter was not pattered.

(1) Fabrication of Specimen for Measuring Lifetime Value

First, evaluation elements described below were fabricated on a glass substrate without forming a gate electrode.
Evaluation element 1 (evaluation element shown in FIG. 6)
Evaluation element 2 (evaluation element shown in FIG. 7)
Evaluation element 3 (evaluation element shown in FIG. 8)

Fabrication conditions for each of the evaluation element 1 to 3 were as described below.

(1-1) Fabrication of Evaluation Element 1

First, a Mo thin film of 100 nm in thickness as a gate electrode and $SiO_2$ film of 200 nm in thickness as a gate insulator film were successively deposited on a glass substrate ("EAGLE 2000" available from Corning Inc, having a diameter of 100 mm and a thickness of 0.7 mm). The gate electrode was deposited using a pure Mo sputtering target by a DC sputtering method under the conditions: deposition temperature, room temperature; gas pressure, 2 mTorr. Further, the gate insulator film was formed by a plasma CVD method under the conditions: carrier gas, a mixed gas of $SiH_4$ and $N_2O$ ($N_2O$=100 sccm, $SiH_4$=4 sccm, and $N_2$=36 sccm); gas pressure, 200 Pa; plasma power, 300 W; and deposition temperature, 320° C.

Next, an oxide semiconductor layer was formed by a sputtering method. Adopted for the oxide thin film was $InGaZnO_4$ with atomic ratio of In:Ga:Zn=1:1:1. The apparatus used in the sputtering was "CS-200" available from ULVAC, Inc., and the sputtering conditions were as follows.

(Sputtering Conditions)
Substrate temperature: room temperature
Gas pressure: 1 mTorr
Oxygen partial pressure: $O_2/(Ar+O_2)$=4% (in volume ratio)
Film thickness: 40 nm After the oxide semiconductor film was deposited as described above, patterning was carried out by photolithography and wet etching. "ITO-07N" available from Kanto Chemical Co., Inc. was used for the wet etching. In the present invention, size of the oxide semiconductor thin film was controlled to 15 mm square after the patterning (see FIG. 6).

After patterning of each oxide semiconductor layer as described above, a pre-annealing treatment was carried out to improve the film quality. The evaluation element 1 was thus fabricated. The pre-annealing was carried out at 350° C. in 100% oxygen atmosphere under atmospheric pressure for 60 minutes.

(1-2) Fabrication of Evaluation Element 2

Evaluation element 2 was fabricated by forming a passivation film called an etch stopper layer on the evaluation element 1. Deposition conditions of the passivation film were as follows.

Carrier gas: $N_2O$=100 sccm, $SiH_4/N_2$=4/36 sccm
Gas pressure: 133 Pa
Input power: 100 W
Deposition temperature: 230° C.
Film thickness: 100 nm (1-3) Fabrication of Evaluation Element 3

A passivation film called a final passivation film, a laminate film consisting of a $SiO_2$ first layer and a SiN second layer from a side of the substrate was deposited on the evaluation element 2. Deposition conditions of the final passivation film were as follows.

Figure 10:
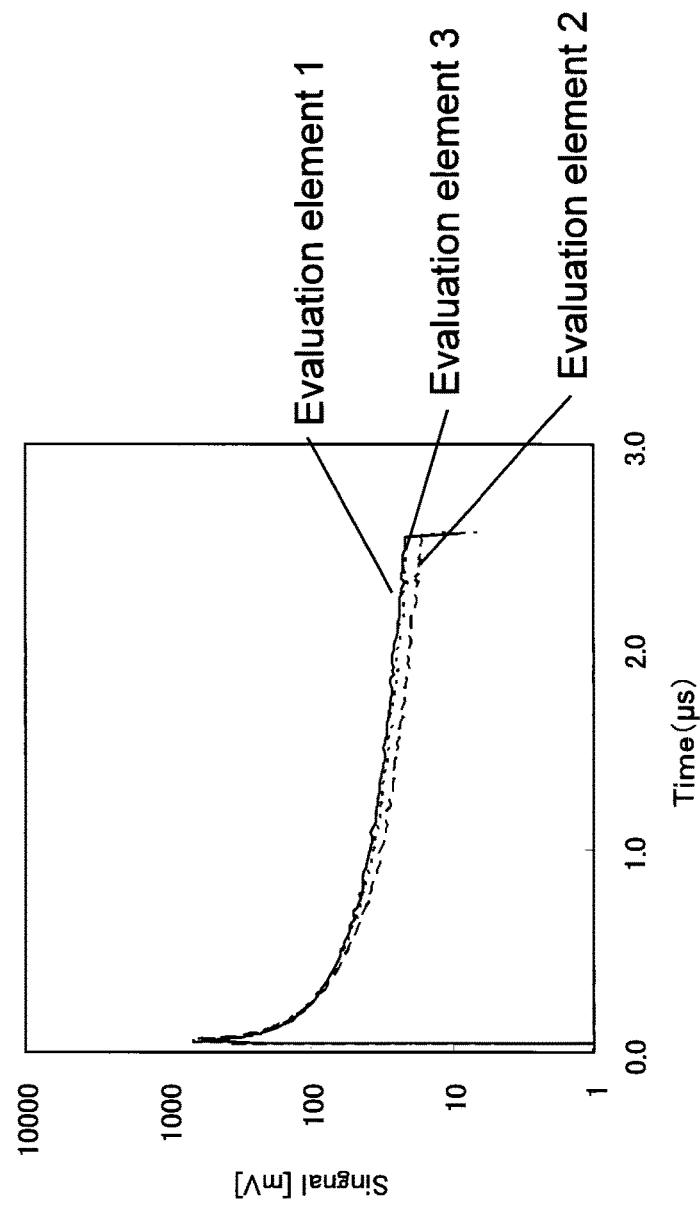
FIG. 10 is a graph showing measurement results of microwave photoconductive decay of the evaluation elements 1 to 3 in Example 3.

The first layer:
Carrier gas: $N_2O$=100 sccm, $SiH_4/N_2$=4/36 sccm
Gas pressure: 133 Pa
Input power: 100 W
Deposition temperature: 150° C.
Film thickness: 100 nm
The second layer:
Carrier gas: $N_2O$=100 sccm, $SiH_4$=12.5 sccm, and $N_2$=297.5 sccm
Gas pressure: 133 Pa
Input power: 100 W
Deposition temperature: 150° C.
Film thickness: 150 nm Next, by using the evaluation elements 1 to 3 thus obtained, the microwave photo conductivity decay measurements were conducted in a similar manner to Example 1. The result is shown in FIG. 10. Vertical axis of FIG. 10 is intensity of reflection of microwave (in signal).

Moreover, peak value, that is a largest value of reflected microwave from the oxide semiconductor thin film, and lifetime value for each of the evaluation elements obtained by analyses of the curves depicted in FIG. 10 are shown in Table 3.

TABLE 3

|  | Peak value (mV) | Lifetime value (μs) |
| --- | --- | --- |
| Evaluation element 1 | 586 | 0.248 |
| Evaluation element 2 | 680 | 0.173 |
| Evaluation element 3 | 662 | 0.193 |

From the results shown in Table 3, it was found that lifetime values of the evaluation elements 2 and 3 were shorter than that of the evaluation element 1. It is supposed that defects generated at the surface of the oxide semiconductor thin films were recovered by the formation of the etch stopper layer (insulator film) on the surface of the oxide semiconductor thin films of the evaluation elements 2 and 3.

As described above, it was possible to observe variations in the waveform of the microwave reflected by the oxide semiconductor thin film due to the formation of the passivation film even in the evaluation elements 2 and 3 in which an etch stopper layer or a final passivation film was formed. It was thus demonstrated that by utilizing the evaluation method of the present invention not only the evaluation element 1 which did not comprise a passivation film but also the evaluation elements 2 and 3 having a passivation film can be used as an evaluation element implementing the evaluation method according to the present invention.

Example 4

Conducted in this example were similar experiments to aforementioned Example 3 by using evaluation elements with a passivation film having various patterning sizes as described below.
(1) Fabrication of Specimen for Measuring Lifetime Value First, evaluation elements described below were fabricated on a glass substrate without forming a gate electrode.
Evaluation element 1: patterning size of 15 mm square (the same as the evaluation element 3 in Example 3)
Evaluation element 2: without patterning (the same as that shown in FIG. 5)
Evaluation element 3: patterning size of 15 mm square The evaluation element 2 was prepared in a similar manner to the evaluation element 3 in Example 3 except for not conducting the patterning.

The evaluation element 3 was prepared in a similar manner to the evaluation element 1 in Example 3 except for making the patterning size of 5 mm square. The patterning size was adjusted by using a mask having a different pattern size.

Figure 11:
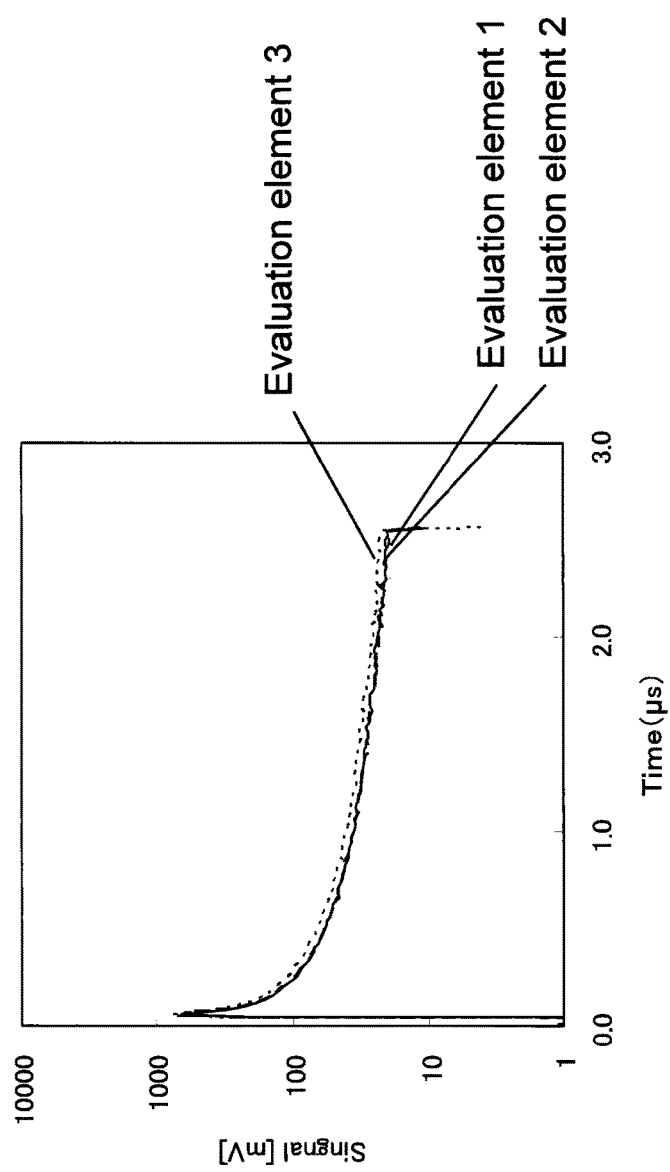
FIG. 11 is a graph showing measurement results of microwave photoconductive decay of the evaluation elements 1 to 3 in Example 4.

Next, by using the evaluation elements 1 to 3, the microwave photo conductivity decay measurements were conducted in a similar manner to Example 1. The result is shown in FIG. 11. Vertical axis of FIG. 11 is intensity of reflection of microwave (in signal).

Moreover, peak value, that is a largest value of reflected microwave from the oxide semiconductor thin film, and lifetime value for each of the evaluation elements obtained by analyses of the curves depicted in FIG. 11 are shown in Table 4.

TABLE 4

|  | Peak value (mV) | Lifetime value (μs) |
| --- | --- | --- |
| Evaluation element 1 | 662 | 0.193 |
| Evaluation element 2 | 667 | 0.194 |
| Evaluation element 3 | 627 | 0.193 |

From the results shown in Table 4, it was found that peak values and lifetime values of the evaluation elements 1 to 3 were approximately the same one another. It was thus demonstrated that the stress stability can be evaluated by using the evaluation method according to the present invention regardless of the presence or absence of patterning and patterning size.

In particular, it is of significant use that the evaluation method according to the present invention is viable even with the evaluation element 3 having a patterning size of 5 mm square which is smaller than a size of a microwave waveguide (10 mm square). This supports that quality control (including in-plane distribution on a glass substrate and variation among different glass substrates or the like) of oxide semiconductor thin films such as shown in FIG. 9 in which a plurality of evaluation elements is orderly arrayed.

Example 5

Experiments were conducted in Example 5 as described below in order to evaluate correlation between lifetime value and stress stability ($\Delta V_{th}$) of the oxide semiconductor thin film in terms of pre-annealing temperature dependency.
(1) Preparation of Specimens for Measurement of Lifetime Value First, an IGZO oxide semiconductor thin film was sputter-deposited on a glass substrate ("EAGLE XG" available from Corning Inc, having a diameter of 100 mm and a thickness of 0.7 mm) under the conditions shown below.
Sputtering apparatus: "CS-200" available from ULVAC, Inc.
Composition of sputtering target: $InGaZnO_4$ (In:Ga:Zn=1:1:1 (in atomic ratio)
Substrate temperature: room temperature
Thickness of oxide semiconductor layer: 40 nm
Addition amount of oxygen: $O_2/(Ar+O_2)$=4%, 8% (in volume ratio)
Gas pressure: 1 mTorr Then, various kinds of specimens were prepared by varying conditions of the pre-annealing treatment (pre-annealing temperature here) for the purpose of changing $\Delta V_{th}$ of the oxide semiconductor thin films. Specifically, various specimens were obtained by changing the pre-annealing temperature to 250° C., 300° C., and 350° C. while conditions (for 1 hour in air) other than the pre-annealing temperature were fixed constant.

For each of the specimens thus obtained, lifetime measurements based on the microwave photo conductivity decay were conducted. Concretely, the microwave photo conductivity decay method was carried out using a device (specifically, LTA-1820SP available from KOBELCO Research Institute, Inc.) of such configuration as shown in FIG. 1 in the Patent Document 2 under the following conditions, and change of the reflectivity was observed.

Wavelength of laser: 349 nm (UV light)
Pulse width: 15 ns
Pulse energy: 1 μJ/pulse
Beam diameter: 1.5 mmø
Number of pulse per measurement: 64 shots
Apparatus: LTA-1820SP available from KOBELCO Research Institute, Inc.

Figure 15A:
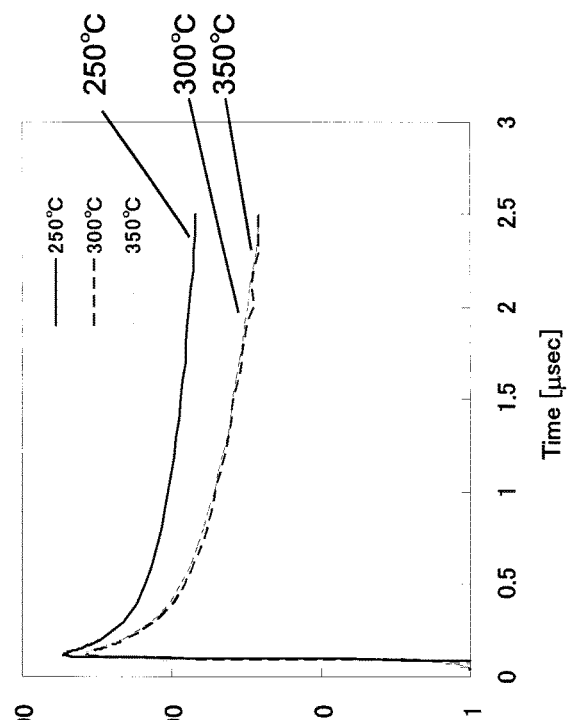
FIG. 15A and FIG. 15B show the measurement results when additive amounts of oxygen are 4% and 8%, respectively.
Figure 15B:
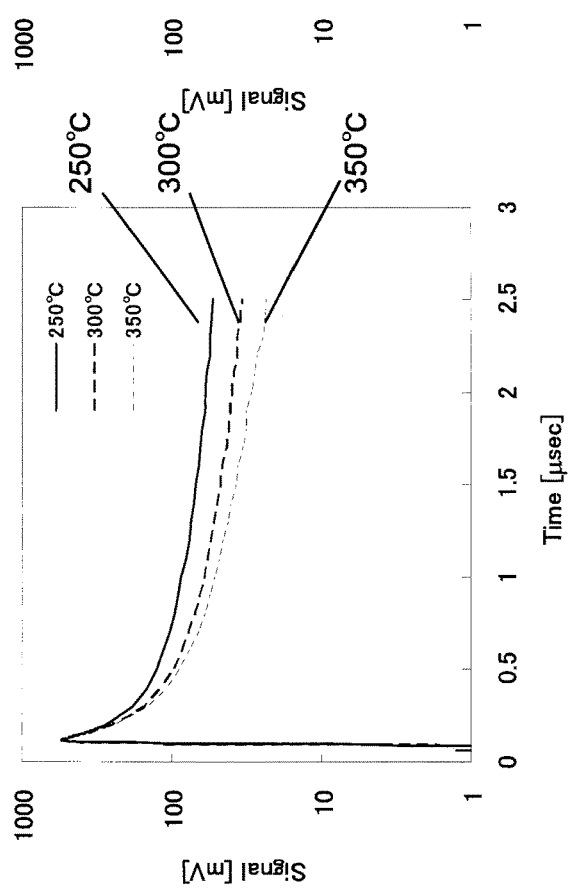

Results of the measurement based on the microwave photo conductivity decay are shown in FIG. 15. FIG. 15A and FIG. 15B show the measurement results when additive amounts of oxygen were 4% and 8%, respectively. Vertical axis of the figures is intensity of reflection of microwave (in signal). It was elucidated from the figures that the lifetime values decrease as the annealing temperature increases, presumably due to decrease of defects and carrier trapping in the oxide semiconductor thin film.

(2) Preparation of a TFT Specimen for Evaluating TFT Characteristics and Stress Stability In order to confirm TFT characteristics of the specimen prepared in (1), a TFT was prepared as shown in FIG. 2 and its TFT characteristics and stress stability were evaluated.

First, a Mo thin film of 100 nm in thickness as a gate electrode and $SiO_2$ film of 200 nm in thickness as a gate insulator film were successively deposited on a glass substrate ("EAGLE 2000" available from Corning Inc, having a diameter of 100 mm and a thickness of 0.7 mm). The gate electrode was deposited using a pure Mo sputtering target by a DC sputtering method under the conditions: deposition temperature, room temperature; gas pressure, 2 mTorr. Further, the gate insulator film was formed by a plasma CVD method under the conditions: carrier gas, a mixed gas of $SiH_4$ and $N_2O$ ($N_2O$=100 sccm, $SiH_4$=4 sccm, and $N_2$=36 sccm); plasma power, 300 W; and deposition temperature, 320° C.

Next, an oxide semiconductor layer was formed by a sputtering method. Adopted for the oxide thin film was IGZO with atomic ratio of In:Ga:Zn=1:1:1. The apparatus used in the sputtering was "CS-200" available from ULVAC, Inc., and the sputtering conditions were as follows:

Substrate temperature: room temperature
Gas pressure: 1 mTorr
Oxygen partial pressure: $O_2/(Ar+O_2)$=4%, 8% (in volume ratio)
Film thickness: 40 nm After the oxide semiconductor film was deposited as described above, patterning was carried out by photolithography and wet etching. "ITO-07N" available from Kanto Chemical Co., Inc. was used for the wet etching.

After the patterning, a pre-annealing treatment was conducted for the purpose of improving the quality of the oxide semiconductor film. The pre-annealing was carried out in air atmosphere for 60 minutes.

Next, a $SiO_2$ film of 100 nm in thickness was formed by plasma CVD method, followed by patterning by way of photolithography and dry etching to obtain a passivation layer (an etch stopper layer).

Then, a source-drain electrode was formed using pure Mo by DC sputtering method followed by patterning. The film thickness was 100 nm. The deposition method and the patterning method were the same as for the gate electrode. For each TFT, the channel length was set to 10 μm and the channel width was set to 200 μm.

After the source-drain electrode was formed as described above, a passivation layer to protect an oxide semiconductor layer was formed thereon. A layered film having the total thickness of 400 nm consisting of $SiO_2$ having a thickness of 200 nm and SiN having a thickness of 200 nm was used as the passivation layer. The formation of the $SiO_2$ and SiN films described above was carried out by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film, and a mixed gas of $SiH_4$, $N_2$ and $NH_3$ was used for the formation of the SiN film. In both cases, the film formation power was set to 100 W and the film formation temperature was set to 150° C.

Then, a contact hole to be used for probing to evaluate transistor characteristics was formed in the passivation layer by photolithography and dry etching to obtain a TFT.

For each of the TFTs thus obtained, (A) transistor characteristics [drain current ($I_d$)-gate voltage ($V_g$) characteristics] and (B) variation of the threshold voltage ($\Delta V_{th}$) were evaluated before and after applying the stress as explained below.

(A) Measurement of Transistor Characteristics

A semiconductor parameter analyzer "4156C" available from National Instruments was used for measuring the transistor characteristics. The detailed measurement conditions were as described below.

Source voltage: 0 V
Drain voltage: 10 V
Gate voltage: −30 to 30 V (measurement increment: 1 V)

(B) Evaluation of $\Delta V_{th}$ as the Stress Stability (Light Irradiation while Applying Negative Bias as the Stress)

In the present example, stress application tests were carried out by white light irradiation while applying negative bias to the gate electrode for simulation of environments (stress) at the time of actual panel drive. The stress application conditions were as described below. As the wavelength of light, about 400 nm was selected, which is near the band gaps of oxide semiconductors and at which transistor characteristics may easily vary.

Gate voltage: −20 V
Substrate temperature: 60° C.
Light stress:
Light source: white light source
Illuminance (intensity of light irradiated onto TFTs): 25,000 NIT
Irradiation device: YSM-1410 available from Yang Electronic Systems Co., Ltd.
Stress application time: 2 hours Here, the threshold voltage is, roughly speaking, a value of the gate voltage $V_g$ when the transistor is shifted from the off-state (the state where the drain current $I_d$ is low) to the on-state (the state where the drain current is high). In the present example, the voltage when the drain current is around 1 nA between the on-state current and the off-state current was defined as the threshold voltage, and variation of the threshold voltage (the amount of shift, $\Delta V_{th}$) was measured before and after applying the stress. A TFT having smaller $\Delta V_{th}$ is considered superior in terms of the stress stability.

Figure 16A:
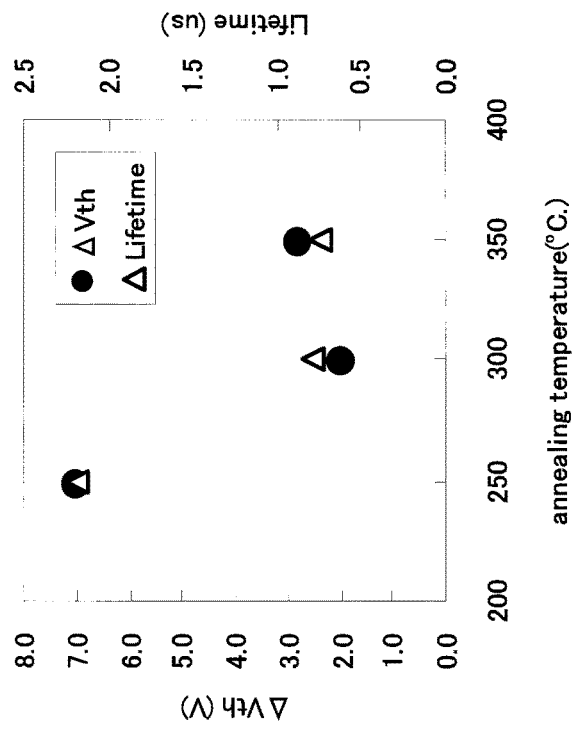
FIG. 16A and FIG. 16B show the measurement results when additive amounts of oxygen are 4% and 8%, respectively.
Figure 16B:
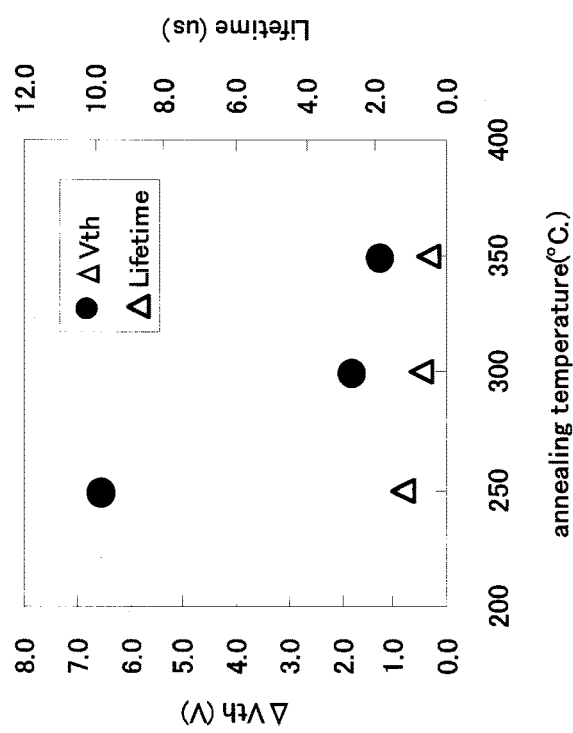

Relations between the pre-annealing time and $\Delta V_{th}$ as well as the pre-annealing time and lifetime values are shown in FIG. 16. In FIG. 3, the $\Delta V_{th}$ and the lifetime values are indicated by filled circle and open triangle, respectively. The partial pressures of oxygen were 4% and 8% in FIG. 16A and FIG. 16B, respectively.

The relations showed a similar profile to each other as evident in FIG. 3, elucidating behaviors of the $\Delta V_{th}$ and the lifetime values are in accord. It was thus demonstrated that the stress stability of the TFT can be indirectly but accurately evaluated by the evaluation method based on the lifetime values according to the present invention.

Example 6

Experiments described below were carried out for an oxide semiconductor film having a passivation film on the surface in Example 6 in order to evaluate correlation between lifetime value and stress stability ($\Delta V_{th}$).
(1) Preparation of Specimens for Measurement of Lifetime Value First, an IGZO oxide semiconductor thin film was sputter-deposited on a glass substrate ("EAGLE XG" available from Corning Inc, having a diameter of 100 mm and a thickness of 0.7 mm) under the conditions shown below.

Sputtering apparatus: "CS-200" available from ULVAC, Inc.

Composition of sputtering target: InGaZnO$_4$ (In:Ga:Zn=1:1:1 (in atomic ratio)

Substrate temperature: room temperature

Thickness of oxide semiconductor layer: 40 nm

Addition amount of oxygen: O$_2$/(Ar+O$_2$)=4%, 8% (in volume ratio)

Gas pressure: 1 mTorr

Then a pre-annealing treatment was carried out at 350° C. under air atmosphere for 1 hour for the purpose of improving the film quality.

Further, a SiO$_2$ was deposited as a passivation film on the oxide semiconductor film. The formation of the SiO$_2$ film was carried out by a plasma CVD method using "PD-220NL" available from SAMCO Inc. The deposition conditions were as explained below. Three kinds of specimens were prepared by changing the deposition temperature.

Carrier gas: N$_2$O=100 sccm, SiH$_4$=4 sccm, and N$_2$=36 sccm

Gas pressure: 133 Pa

Plasma power: 100 W

Deposition temperature: 150° C., 200° C., and 230° C.

Film thickness: 100 nm

For each of the TFTs thus obtained, a lifetime measurement was carried out by using the microwave photo conductivity decay in the similar manner to Example 1.

Results of the measurement based on the microwave photo conductivity decay are shown in FIG. 17. Vertical axis of the figure is intensity of reflection of microwave (in signal). It was found that the lifetime values decrease as the deposition temperature of SiO$_2$ increases.
(2) Preparation of a TFT Specimen for Evaluating TFT Characteristics and Stress Stability In order to confirm TFT characteristics of the specimen prepared in (1), a TFT was prepared as shown in FIG. 2 and its TFT characteristics and stress stability were evaluated in the similar manner to Example 1.

Figure 18:
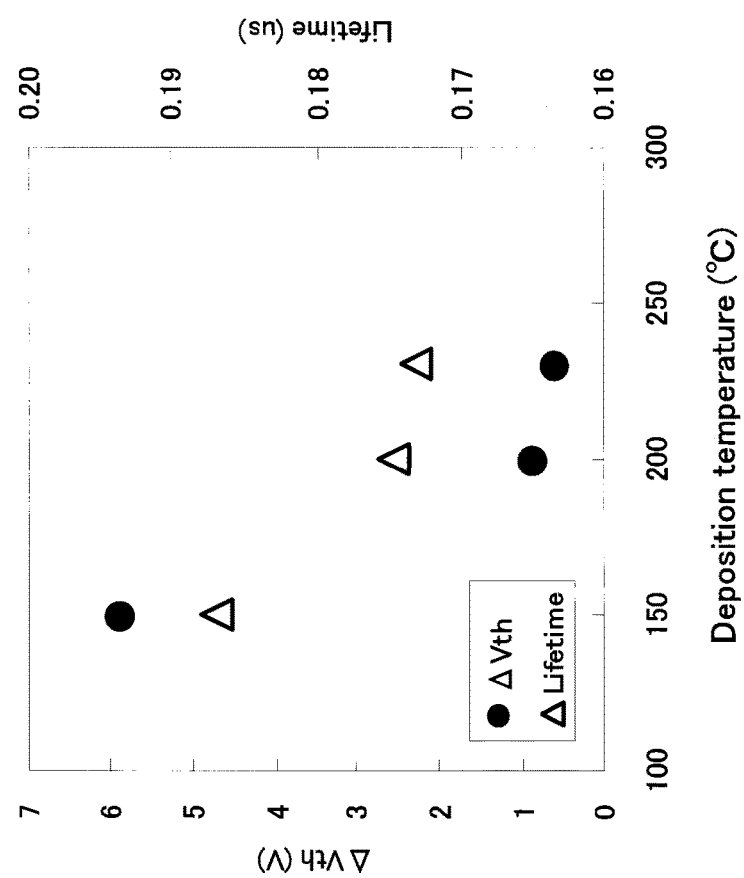
FIG. 18 is a graph showing $\Delta V_{th}$ or a lifetime and deposition temperature in Example 6.

In FIG. 18, relation between the deposition temperature and $\Delta V_{th}$ (indicated by filled circle in the figure) as well as relation between the deposition temperature and the life time values (indicated by open triangle in the figure) are shown.

The relations showed a similar profile to each other as evident in the figure, elucidating behaviors of the $\Delta V_{th}$ and the lifetime values are in accord. It was thus demonstrated that the stress stability of the TFT even with a passivation film can be indirectly but accurately evaluated by the evaluation method based on the lifetime values according to the present invention.

Example 7

The specimens were fabricated and experiments were conducted in Example 7 as described below in order to evaluate correlation among lifetime value, peak value, and stress stability ($\Delta V_{th}$).
(1) Fabrication of Specimens for Measuring Lifetime Value Four kinds of specimens were prepared by adding one having a SiO$_2$ passivation layer deposited at 250° C. to the specimens of Example 6. Conditions to prepare the specimens other than the SiO$_2$ deposition temperature were the same as those of Example 3.

Deposition temperature: 150° C., 200° C., 230° C., and 250° C.

Figure 19:
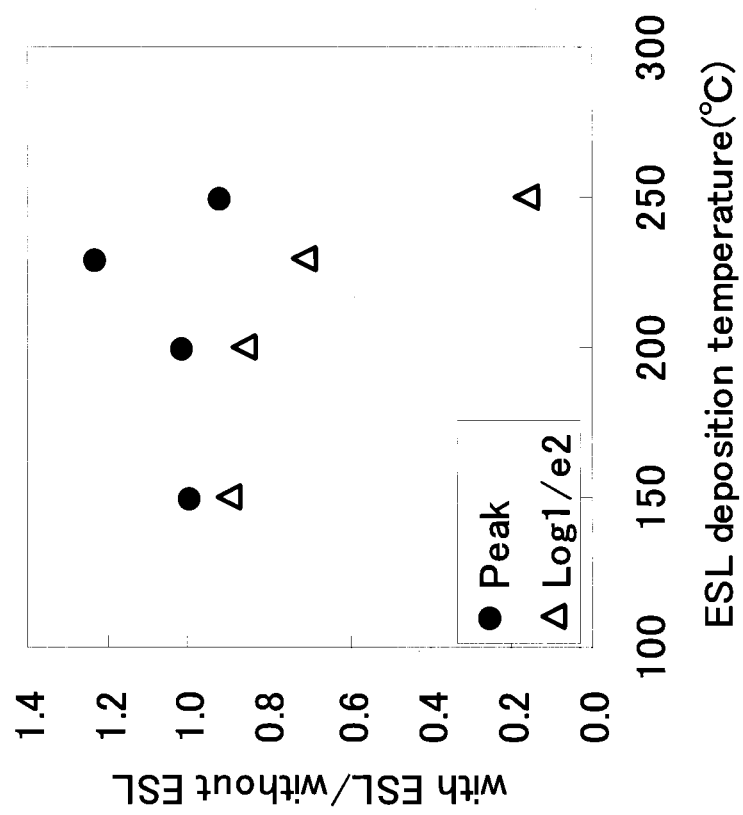
FIG. 19 is a graph showing results of Example 7. Vertical axis of the graph is a peak ratio or a lifetime ratio with or without a passivation layer in Example 1.

Results of the measurement based on the microwave photo conductivity decay conducted in the similar manner to Example 1 for the specimens before and after forming the passivation layer are shown in FIG. 19. Vertical axes of FIG. 19 are the peak ratio with and without the passivation layer and the lifetime ratio.

It was elucidated from the figure that the lifetime values decreased as the deposition temperature of SiO$_2$ increased. The peak ratio, on the other hand, reached the maximum value when the deposition temperature was 230° C., then decreased when the deposition temperature was 250° C.
(2) Preparation of a TFT Specimen for Evaluating TFT Characteristics and Stress Stability In order to confirm TFT characteristics of the specimen prepared in (1), a TFT was prepared as shown in FIG. 2 and its TFT characteristics and stress stability were evaluated in the similar manner to Example 1.

For each of the deposition temperatures, peak ratio, lifetime ratio, transistor operation, and $\Delta V_{th}$ are shown in Table 5.

TABLE 5

| Deposition temperature (° C.) | Peak ratio | Lifetime ratio | Judgment | Transistor operation | $\Delta V_{th}$ (V) |
|---|---|---|---|---|---|
| 150 | 0.99 | 0.90 | Bad | Good | 6.00 |
| 200 | 1.01 | 0.86 | Good | Good | 1.00 |
| 230 | 1.23 | 0.71 | Good | Good | 0.75 |
| 250 | 0.91 | 0.16 | Bad | Bad | — |

As shown in the table in the above, when the deposition temperature was 250° C., carriers in the oxide semiconductor excessively increased and its resistance was excessively lowered, and the specimen did not show the transistor operation.

Specimens were judged "Good" if the peak ratio was 1 or larger and the lifetime ratio was 0.90 or smaller. All the specimen that were judged "Good" showed good transistor operation and their $\Delta V_{th}$ were 1.00 V or smaller.

It was thus demonstrated that the operation and stress stability of the TFT can be indirectly but accurately evaluated by the evaluation method based on the lifetime values according to the present invention.

Example 8

In Example 9, correlation of lifetime values derived from the following evaluation methods 1 to 3 with the threshold value shift by using the same specimen as in the Example 1.

Evaluation 1: slope of log-transformed intensity decay curve of the reflected microwave in a range from 1/e to $1/e^2$ of the maximum value (same as Example 1).

Evaluation 2: Lifetime value $\tau_2$ derived by way of parameter fitting to the expression (1) representing the reflectance of the microwave.

[Expression 1]

$$n_1 \exp(-t/\tau_1) + n_2 \exp(-t/\tau_2) \quad (1)$$

wherein t represents the measurement time in second, $n_1$ and $n_2$ are constants, $\tau_1$ represents lifetime of carriers having a short time constant, and $\tau_2$ represents lifetime of carriers having a long time constant.

Evaluation 3: Lifetime value $\tau_2$ derived by way of parameter fitting to the expression (2) representing the reflectance of the microwave.

[Expression 2]

$$n_1 \exp(-t/\tau_1) + n_2 \exp(-t/\tau_2)^\beta \quad (2)$$

wherein t represents the measurement time in second, $n_1$ and $n_2$ are constants, $\tau_1$ represents lifetime of carriers having a short time constant, $\tau_2$ represents lifetime of carriers having a long time constant, and β represents relaxation factor.

The expression "derived by way of parameter fitting" means that a value is derived by repeating calculation so that correlation coefficient of the whole expression (1) or correlation coefficient of the whole expression (2) is minimized after empirically inputting proper values for $n_1$, $n_2$, $\tau_1$, $\tau_2$ in the expression (1) or $n_1$, $n_2$, $\tau_1$, $\tau_2$, ß in the expression (2). The same applies to Example 9 described below.

Figure 20A:
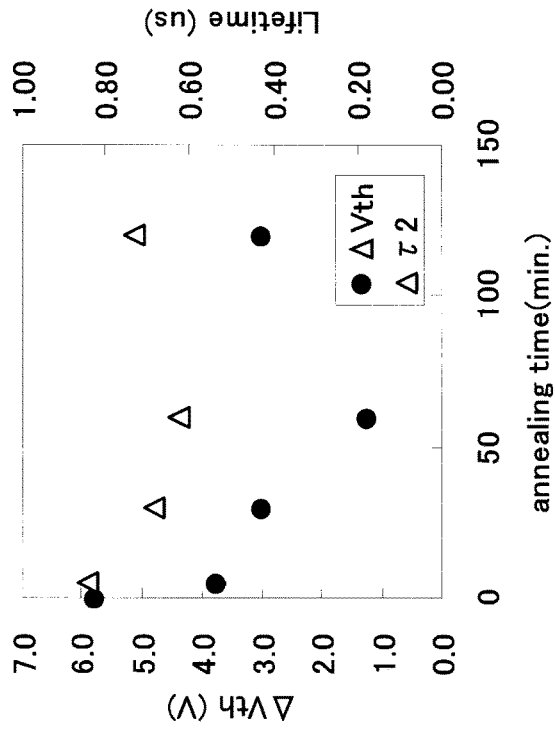
FIGS. 20A and 20B show $\tau_2$ obtained the evaluations 2 and 3, respectively.
Figure 20B:
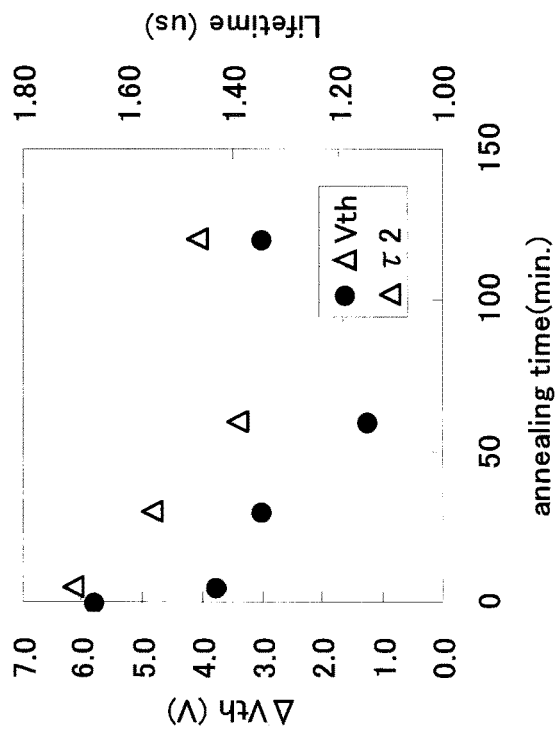
Figure 21A:
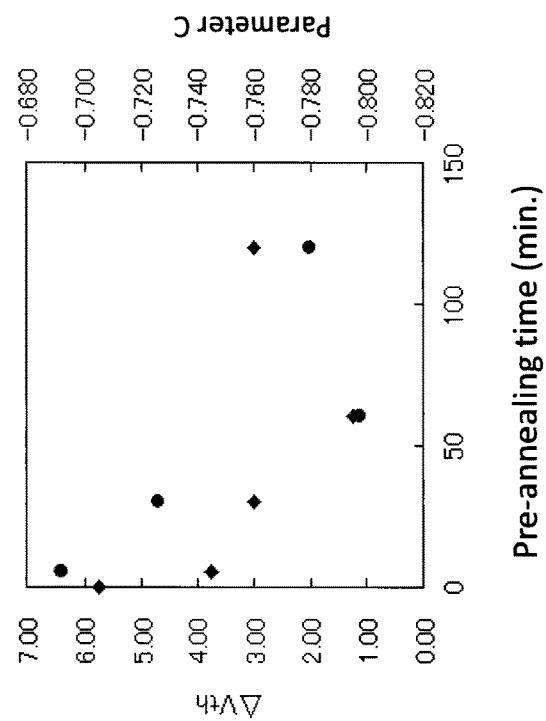
FIG. 21A shows relation between the pre-annealing time and $\Delta V_{th}$ (indicated by filled circle ● in the figure) as well as relation between the pre-annealing time and the parameter B (indicated by filled square ■ in the figure).
Figure 21B:
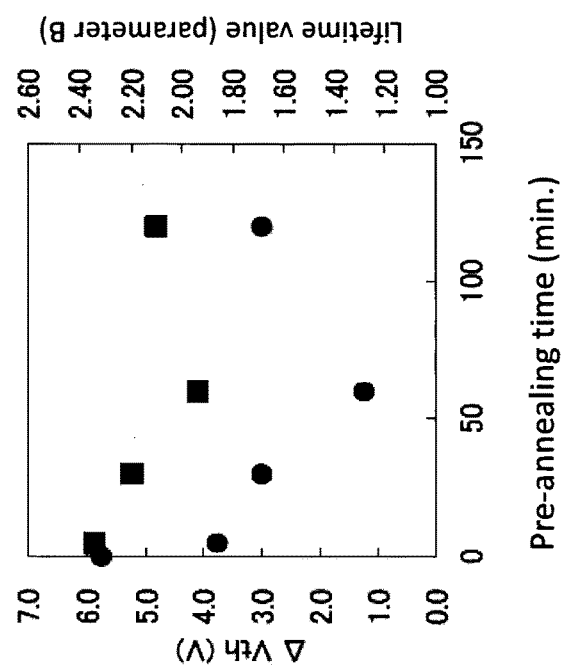
FIG. 21B shows relation between the pre-annealing time and $\Delta V_{th}$ (indicated by filled circle ● in the figure) as well as relation between the pre-annealing time and the parameter C (indicated by filled diamond ♦ in the figure).

Relations between the pre-annealing time and $\Delta V_{th}$ as well as the pre-annealing time and $\tau_2$ are shown in FIG. 20. In FIG. 20, the $\Delta V_{th}$ and the $\tau_2$ are indicated by filled circle and open triangle, respectively. The $\tau_2$ obtained the evaluations 2 and 3 are shown in FIG. 20A and FIG. 20B, respectively.

The relations showed a similar profile to each other in a similar manner to Example 1, elucidating behaviors of the $\Delta V_{th}$ and the lifetime values are in accord. It was thus demonstrated that the stress stability of the TFT can be evaluated by any of the evaluation methods 1 to 3.

Example 9

In Example 9, correlation of lifetime values derived from the following evaluation methods 1 to 3 with the threshold value shift by using the same specimen as in the Example 1.

Evaluation 1: slope of log-transformed intensity decay curve of the reflected microwave in a range from 1/e to $1/e^2$ of the maximum value (same as Example 1).

Evaluation 2: Lifetime value (parameter B) derived by way of parameter fitting to the expression (3) representing the reflectance of the microwave.

[Expression 3]

$$y = A \times \exp(-x/B) \quad (3)$$

wherein x is the measurement time and y is reflectance.

Evaluation 3: Lifetime value (parameter C) derived by way of parameter fitting to the expression (4) representing the reflectance of the microwave.

[Expression 4]

$$y = A \times x^C \quad (4)$$

wherein x is the measurement time and y is reflectivity.

In FIG. 20A, relation between the pre-annealing time and $\Delta V_{th}$ (indicated by filled circle ● in the figure) as well as relation between the pre-annealing time and the parameter B derived by the evaluation 2 (indicated by filled square ■ in the figure) are shown. In FIG. 20B, relation between the pre-annealing time and $\Delta V_{th}$ (indicated by filled circle ● in the figure) as well as relation between the pre-annealing time and the parameter C derived by the evaluation 3 (indicated by filled diamond ♦ in the figure) are shown. In the present example, measurement time in the expressions (3) and (4) were controlled to 1-2 µs in which the microwave decay curve is hardly affected by recombination in deep energy states and noises of the apparatus.

It was found from these figures that $\Delta V_{th}$, parameter B, and parameter C showed similar profile in a similar manner to Example 1, indicating behaviors of $\Delta V_{th}$, parameter B, and parameter C are in accord. It was thus demonstrated that stress stability of TFTs can be evaluated by using either method of evaluation 1 and evaluation 2. Further, it was also revealed from the experimental results that not only the lifetime values described in the Examples but also the lifetime value (parameter B) calculated from the exponential function of the expression (3) and the parameter C represented by the power multiplier of the expression (4) are useful parameters to evaluate the stress stability of an oxide semiconductor thin film according to the present invention.

The invention claimed is:

1. A method for identifying an oxide semiconductor thin film with desired stress stability, the method comprising:
    irradiating both excitation light and microwave radiation to a specimen on which an oxide semiconductor thin film is formed,
    measuring a maximum intensity of reflected wave of the microwave radiation, which varies with an irradiation of the excitation light, from the oxide semiconductor thin film, then
    stopping the irradiation of the excitation light, and thereafter
    measuring a variation in reflectance with time of the microwave radiation reflected by the oxide semiconductor thin film after the stopping,
    calculating, from the variation in the reflectance, a parameter that corresponds to slow attenuation observed about 1 µs after the stopping for the oxide semiconductor thin film, and
    identifying the oxide semiconductor thin film that has a value of the parameter within a predetermined range as the oxide semiconductor thin film with the desired stress stability.

2. The method according to claim 1, wherein the stress stability of the oxide semiconductor thin film is evaluated by both the parameter corresponding to the slow attenuation of the reflectance of the microwave radiation observed about 1 µs after the stopping of the excitation light and the maximum intensity of reflectance of the microwave radiation.

3. The method according to claim 1, wherein the parameter is a lifetime value.

4. The method according to claim 1, wherein the oxide semiconductor thin film comprises at least one element selected from the group consisting of In Ga, Zn, and Sn.

5. The method according to claim 1, wherein the oxide semiconductor thin film is deposited on a surface of a gate insulator film.

6. The method according to claim 1, wherein a passivation film is formed on a surface of the oxide semiconductor thin film.

7. An evaluation element, comprising
a substrate,
the oxide semiconductor thin film identified by the method according to claim 1,
wherein the oxide semiconductor thin film is formed on the substrate.

8. The evaluation element according to claim 7, wherein the oxide semiconductor thin film is formed directly on the substrate.

9. The evaluation element according to claim 7, wherein the oxide semiconductor thin film is formed directly on a surface of a gate insulator film.

10. The evaluation element according to claim 7, wherein a passivation film is formed on a surface of the oxide semiconductor thin film.

11. An evaluation device, comprising
a plurality of the evaluation elements according to claim 7 arrayed on a substrate.

12. The method according to claim 1, wherein the parameter is
a time until the intensity of the reflected microwave attenuates to lie: of the maximum value;
a slope of a log-transformed intensity decay curve of the reflected microwave in a range of from $1/e$ to $1/e^2$ of the maximum value, or an absolute value of inverse of the slope;
a slope of a decay curve of the reflected microwave in a range of about 1 µs to 2 µs after the stopping of the excitation light, or an absolute value of inverse of the slope;
an intensity of the reflected microwave observed about 1 µs after the stopping of the excitation light;
a lifetime value τ2 derived by parameter fitting to Expression (1) representing the reflectance of the microwave:

$$n_1\exp(-t/\tau_1)+n_2\exp(-t/\tau_2) \quad \text{Expression (1)}$$

where t represents measurement time in second, n1 and n2 are constants, τ1 represents lifetime of carriers having a short time constant, and τ2 represents lifetime of carriers having a long time constant;
a lifetime value $\tau_2$ derived by parameter fitting to Expression (2) representing the reflectance of the microwave:

$$n_1\exp(-t/\tau_1)+n_2\exp(-t/\tau_2)^\beta \quad \text{Expression (2)}$$

where t represents measurement time in second, $n_1$ and $n_2$ are constants, $\tau_1$ represents lifetime of carriers having a short time constant, $\tau_2$ represents lifetime of carriers having a long time constant, and β represents a relaxation factor;
a lifetime value B derived by parameter fitting to Expression (3) representing the reflectance of the microwave:

$$y=A\times\exp^{(-x/B)} \quad \text{Expression (3)}$$

where y is reflectance, A is a constant, and x is measurement time; or
a lifetime value C derived by parameter fitting to Expression (4) representing the reflectance of the microwave:

$$y=A\times x^C \quad \text{Expression (4)}$$

where y is reflectance, A is a constant, and x is measurement time.

13. The method according to claim 1, wherein the stress stability of the oxide semiconductor thin film represents resistance to stress caused by light irradiation and/or voltage application.

14. The method according to claim 13, wherein the stress stability is defined as threshold voltage shift $\Delta V_{th}$ of the oxide semiconductor thin film before and after applying the stress.

15. The method according to claim 1, wherein the parameter is a lifetime ratio, and the predetermined range is 0.90 or smaller.

16. A method for controlling quality of an oxide semiconductor thin film in a manufacturing process of a semiconductor, the method comprising
irradiating both excitation light and microwave radiation to a specimen on which the oxide semiconductor thin film is formed,
measuring a maximum intensity of reflected wave of the microwave radiation, which varies with an irradiation of the excitation light, from the oxide semiconductor thin film, then
stopping the irradiation of the excitation light, and thereafter
measuring a variation in reflectance with time of the microwave radiation reflected by the oxide semiconductor thin film after the stopping,
calculating, from the variation in the reflectance, a parameter that corresponds to slow attenuation observed about 1 µs after the stopping for the oxide semiconductor thin film, and
controlling the quality of the oxide semiconductor thin film by identifying the oxide semiconductor thin film that has a value of the parameter within a predetermined range.

17. The method according to claim 16, wherein the stress stability of the oxide semiconductor thin film represents resistance to stress caused by light irradiation and/or voltage application.

18. The method according to claim 17, wherein the stress stability is defined as threshold voltage shift $\Delta V_{th}$ of the oxide semiconductor thin film before and after applying the stress.

19. The method according to claim 16, Wherein the parameter is a lifetime ratio, and the predetermined range is 0.90 or smaller.

20. A method for comparing stress stability of at least two oxide semiconductor thin films, the method comprising:
irradiating both excitation light and microwave radiation to a specimen on which each of the oxide semiconductor thin films is formed,
measuring a maximum intensity of reflected wave of the microwave radiation, which varies with an irradiation of the excitation light, from each of the oxide semiconductor thin films, then
stopping the irradiation of the excitation light, and thereafter
measuring a variation in reflectance with time of the microwave radiation reflected by each of the oxide semiconductor thin films after the stopping,
calculating, from the variation in the reflectance, a parameter that corresponds to slow attenuation observed about 1 µs after the stopping for each of the oxide semiconductor thin films, and
identifying the oxide semiconductor thin film that has a small value of the parameter as having a stress stability superior to the oxide semiconductor thin film that has a large value of the parameter.

* * * * *